(12) United States Patent
Chan et al.

(10) Patent No.: US 6,365,465 B1
(45) Date of Patent: Apr. 2, 2002

(54) SELF-ALIGNED DOUBLE-GATE MOSFET BY SELECTIVE EPITAXY AND SILICON WAFER BONDING TECHNIQUES

(75) Inventors: Kevin K. Chan, Staten Island; Guy M. Cohen, Mohegan Lake; Yuan Taur, Bedford; Hon-Sum P. Wong, Cappaqua, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/272,297

(22) Filed: Mar. 19, 1999

(51) Int. Cl.$^7$ ............................................. H01L 21/336
(52) U.S. Cl. ........................ 438/283; 438/157; 438/300; 438/269
(58) Field of Search ................... 438/283, 157, 438/300, 269, 257; 257/347

(56) References Cited

U.S. PATENT DOCUMENTS

| | | | |
|---|---|---|---|
| 5,102,819 A | * 4/1992 | Matsushita et al. | 438/404 |
| 5,120,666 A | 6/1992 | Gotou | 438/164 |
| 5,166,084 A | 11/1992 | Pfiester | 438/151 |
| 5,273,921 A | * 12/1993 | Neudeck et al. | 438/157 |
| 5,371,401 A | 12/1994 | Kurita | 257/524 |
| 5,646,058 A | * 7/1997 | Taur et al. | 438/283 |
| 5,708,286 A | 1/1998 | Uesugi et al. | 257/330 |
| 6,143,582 A | * 11/2000 | Vu et al. | 438/30 |

FOREIGN PATENT DOCUMENTS

JP  05-226655  * 9/1993 ............. 257/348

OTHER PUBLICATIONS

Wong, et al., "Self–Aligned (Top and Bottom) Double–Gate with 25 nm Thick Silicon Channel", Eletron Devices Meeting, 1997. Technical Digest., International, 1997, pp. 427–430.*

* cited by examiner

Primary Examiner—Wael Fahmy
Assistant Examiner—Christy Novacek
(74) Attorney, Agent, or Firm—McGinn & Gibb, PLLC; Marian Underweiser, Esq.

(57) ABSTRACT

A structure and a method of manufacturing a double-gate metal oxide semiconductor transistor includes forming a laminated structure having a single crystal silicon channel layer and insulating oxide and nitride layers on each side of the single crystal silicon channel, forming openings in the laminated structure, forming drain and source regions in the openings, doping the drain and source regions, forming a mask over the laminated structure, removing portions of the laminated structure not protected by the mask, removing the mask and the insulating oxide and nitride layers to leave the single crystal silicon channel layer suspended from the drain and source regions, forming an oxide layer to cover the drain and source regions and the channel layer, and forming a double-gate conductor over the oxide layer such that the double-gate conductor includes a first conductor on a first side of the single crystal silicon channel layer and a second conductor on a second side of the single crystal silicon channel layer.

15 Claims, 25 Drawing Sheets

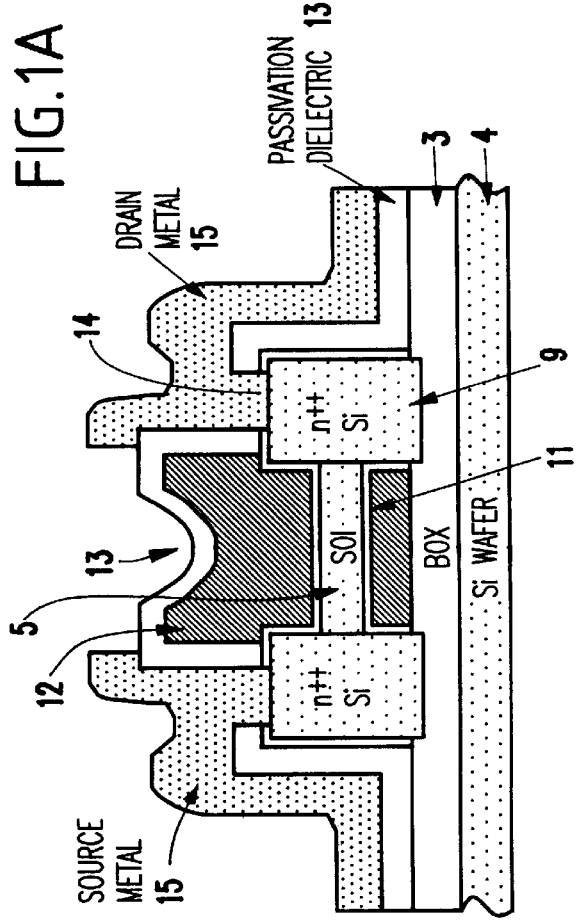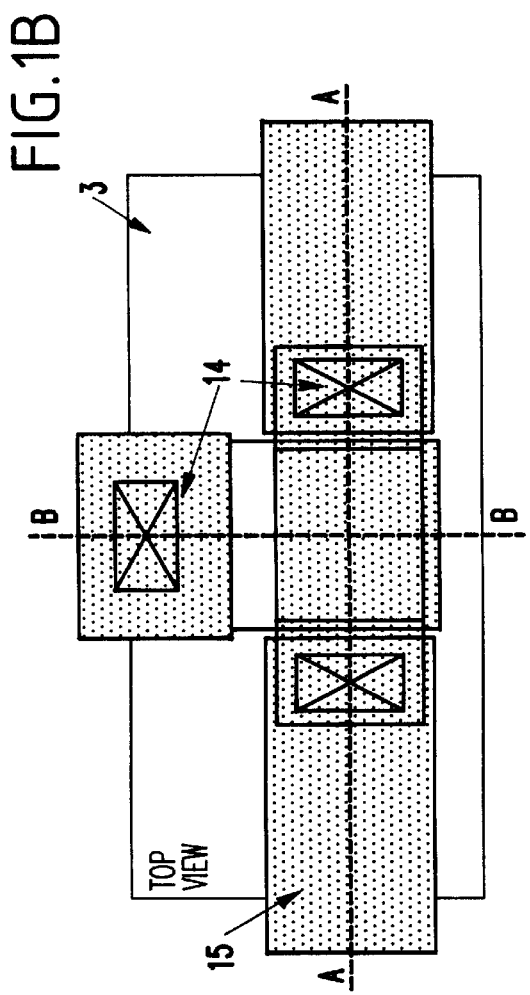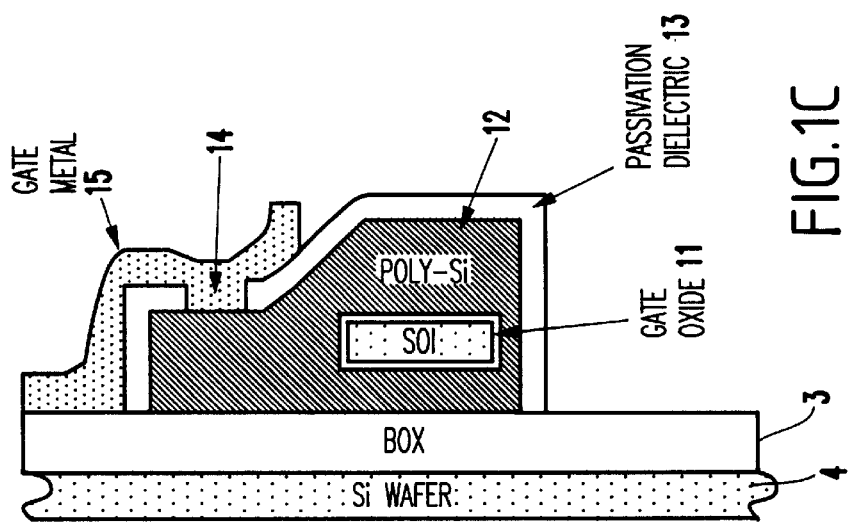

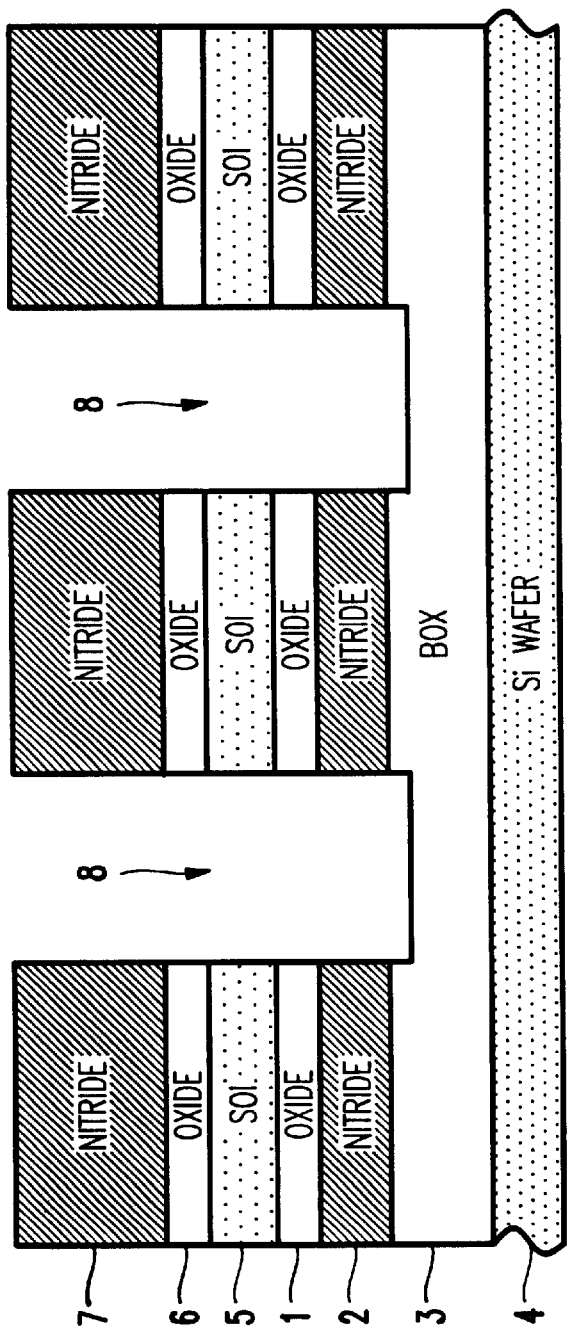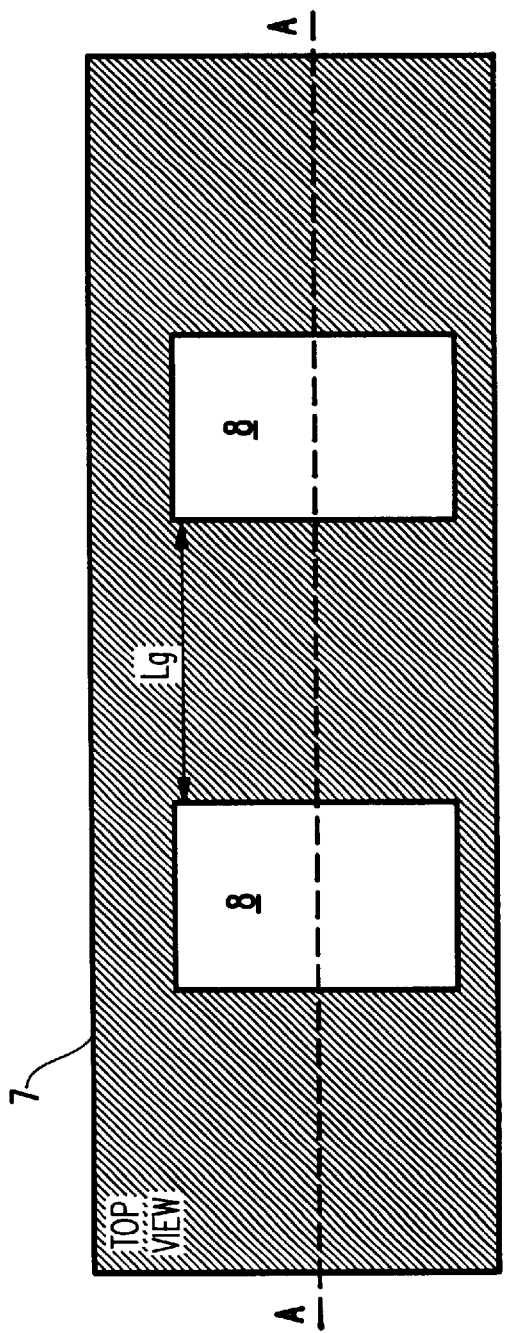

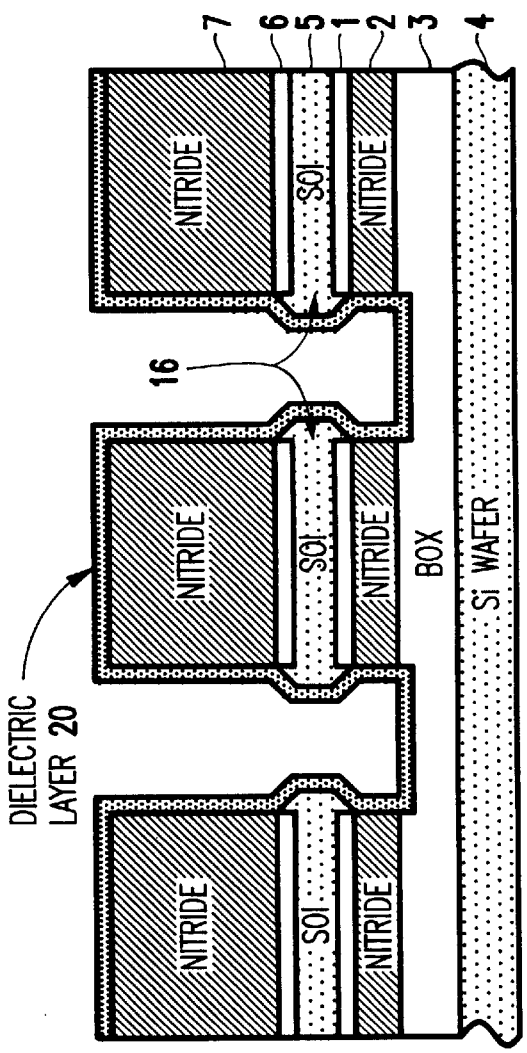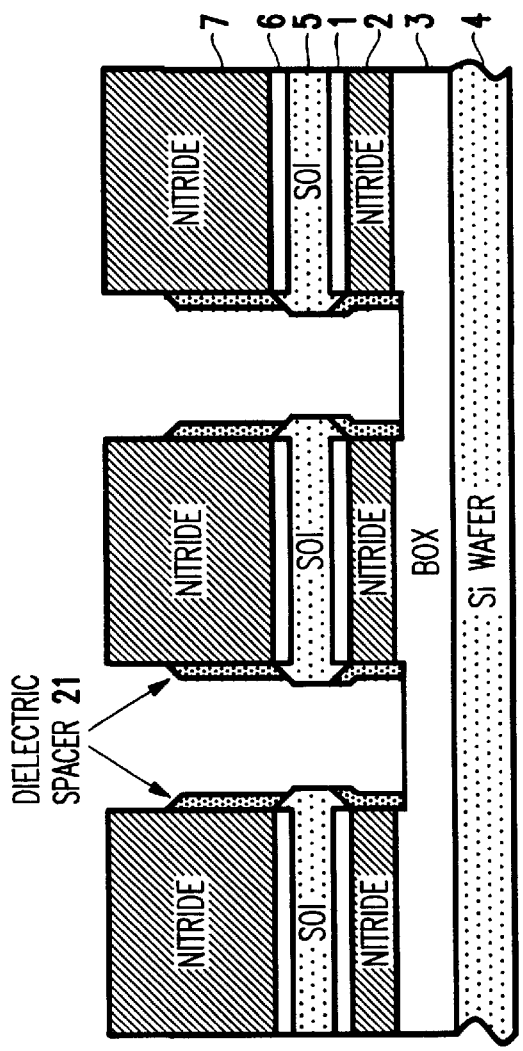

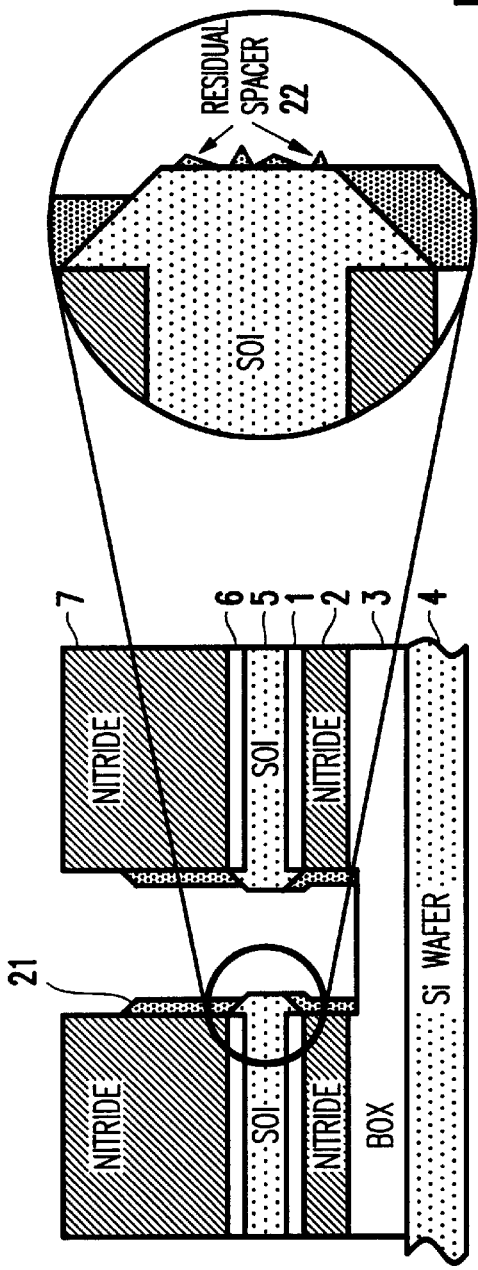
FIG.6C
FIG.6D
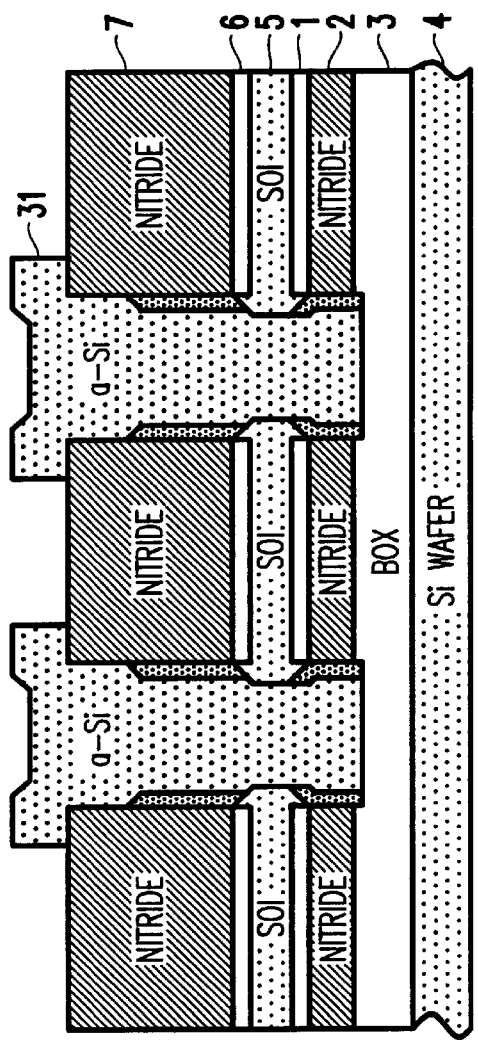
FIG.6E

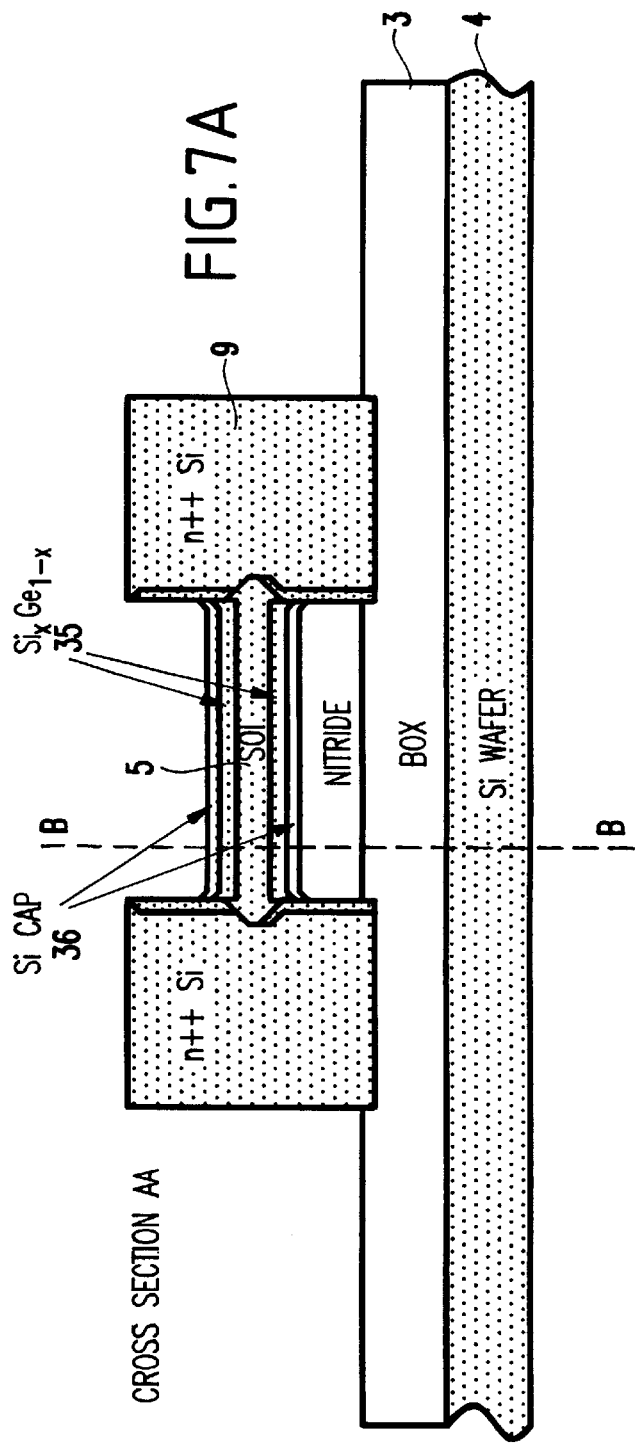
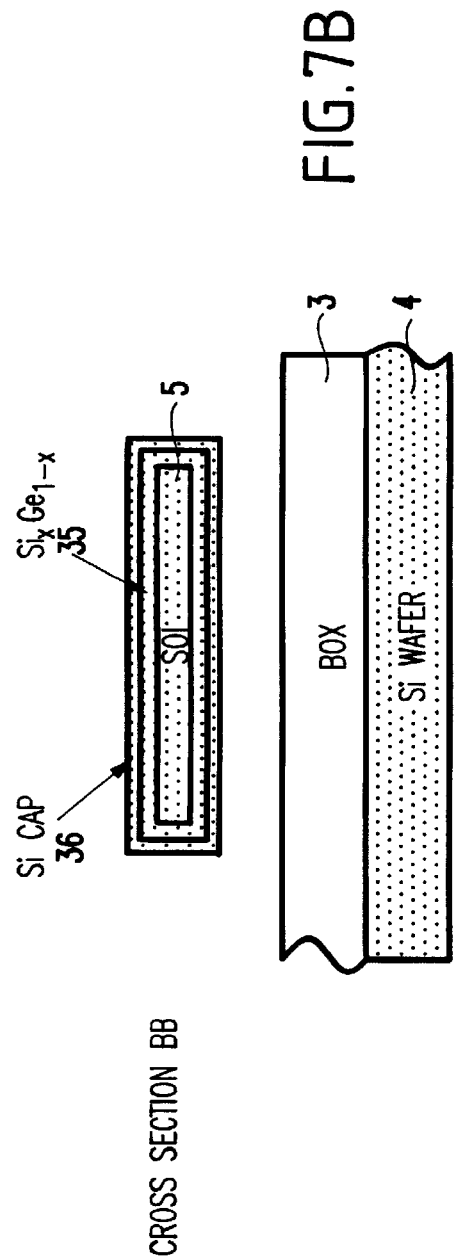

SELF-ALIGNED DOUBLE-GATE MOSFET BY SELECTIVE EPITAXY AND SILICON WAFER BONDING TECHNIQUES

BACKGROUND OF THE INVENTION

1. Field of the Invention

The present invention generally relates to metal oxide semiconductor field effect transistors (MOSFETs) and more particularly to a double-gate MOSFET that has several advantages over conventional single-gate MOSFETs.

2. Description of the Related Art

It is conventionally known that a double-gate MOSFET has several advantages of over conventional single-gate MOSFET structures (dual-gates are side by side, while double-gates from a top and bottom gate structure). For example, the double-gate MOSFET structure has higher transconductance, lower parasitic capacitance and superior short-channel characteristics when compared to single-gate MOSFET structures. Various simulations have shown that a 30 nm channel double-gate MOSFET will show very high transconductance (2300 mS/mm) and very fast switching speeds. Moreover, good short-channel characteristics are obtained down to a 20 nm channel length, which does not require doping. Therefore, double-gate MOSFETs circumvent tunneling breakdown, and avoid the dopant quantization and impurity scattering associated with the conventional doping required in single-channel MOSFET structures.

However there is no conventional method of making a double-gate MOSFET structure which has both the top and bottom gate self-aligned to the channel region. Conventional efforts to form a double-gate MOSFET structure generally fall into three categories.

One method etches silicon into a pillar structure and deposits gates around the pillar structure. However, with this method, it is difficult to form thin vertical pillars (e.g., 10 nm) that are free of reactive ion etching (RIE) damage and to maintain good thickness control.

Another method forms a conventional single-gate MOSFET and uses either selective epitaxy or bond-and-etch-back techniques to form the second gate. However, with this method, it is difficult to keep the top and bottom gate oxides at the same thickness and to align the gates with each other.

A third method begins with a thin SOI film, and patterns tunnels under the SOI film. Then, gate electrodes are deposited in the tunnel around the SOI film. However, this method also suffers silicon thickness control problems and gate alignment problems.

Therefore, there is a need for a method and structure of forming a doublegate MOSFET structure which provides a good oxide thickness control and aligns the top and bottom gates.

SUMMARY OF THE INVENTION

It is, therefore, an object of the present invention to provide a structure and method for solving the foregoing problems with the prior art by providing a double-gate MOSFET. The inventive method utilizes selective lateral epitaxial growth of silicon from an existing single crystal silicon MOSFET channel to form the source/drain regions. The source/drain regions are bounded by pre-defined dielectric boundaries and are thereby limited in size to the local source/drain regions. The dielectric which bounds the selective epitaxial growth is used as a self-aligned implant mask for selective formation of the heavily-doped source/drain regions. The dielectric is then removed after the source/drain formation to result in a suspended silicon channel. The gate insulator and the gate electrodes are subsequently formed to complete the MOSFET.

More specifically, the invention comprises a method of manufacturing a double-gate MOSFET including forming a laminated structure having a single crystal silicon channel layer and insulating oxide and nitride layers on each side of the single crystal silicon channel, forming openings in the laminated structure, forming drain and source regions in the openings, doping the drain and source regions, forming a mesa mask over the laminated structure, removing portions of the laminated structure not protected by the mesa mask, removing the mesa mask and the insulating oxide and nitride layers to leave the single crystal silicon channel layer suspended from the drain and source regions, forming an oxide layer to cover the drain and source regions and the gate channel layer, and forming a double-gate conductor over the oxide layer such that the double-gate conductor includes a first conductor on a first side of the single crystal silicon channel layer and a second conductor on a second side of the single crystal silicon channel layer. During the forming of the double-gate conductor, the drain and source regions and the oxide layer self-align the double-gate conductor.

The forming of the drain and source regions can comprise epitaxially growing silicon in the openings from the single crystal silicon channel layer. The epitaxially growing of the silicon includes introducing one or more of Si, Ge, C and N as dopants or as an alloy.

There are two different issues important to this aspect of the invention. First the introduction of impurities is for the purpose of limiting the diffusion. For example, introduction of carbon reduces boron diffusion. Secondary, forming an alloy such as $Si_xGe_{1-x}$ in the drain and source regions, is a band-gap engineering technique. For example, a $Si_xGe_{1-x}$ source will allow a more efficient sinking of "holes" generated in the channel, thus reducing the "kink effect".

Alternatively, the forming of the drain and source regions can comprise epitaxially growing silicon in a portion of the openings from the single crystal silicon channel layer and filling a remainder of the openings with amorphous silicon to complete the drain and source regions.

The forming of the laminated structure includes attaching a silicon substrate to the laminated structure. The forming of the openings can then include exposing the silicon substrate and the forming of the drain and source regions would comprise epitaxially growing silicon in the openings from the single crystal silicon channel layer and the silicon substrate.

Also, before the forming of the drain and source regions, the method further comprises forming spacers in the openings, to reduce parasitic capacitance. The spacers are also used to form a setback region with respect to the channel for the source and drain implant.

Both n-channel and p-channel devices may be fabricated using the inventive process. The device type depends on the type dopant used for source and drain implantation (e.g., FIG. 4E). Complementary MOS (CMOS) circuits are thus readily implemented with the invention.

The double-gate integrated circuit of the invention includes a channel layer, doped drain and source regions connected to the channel layer, an insulating layer covering the gate channel layer and the doped drain and source regions, a double-gate conductor over the insulating layer (the double-gate conductor includes a first conductor on a first side of the channel layer and a second conductor on a second side of the channel layer), an upper passivation oxide layer adjacent on a first side of the double-gate conductor and a lower passivation oxide layer on an opposite side of the double-gate conductor from the upper passivation oxide layer, wherein a thickness of the insulating layer is independent of a thickness of the upper passivation oxide layer and the lower passivation oxide layer.

The first conductor and the second conductor are self-aligned by the drain and source regions and the insulating layer. The drain and source regions comprise silicon epitaxially grown from the channel layer. The epitaxially grown silicon can include one or more of Si, Ge, C and N. Alternatively, the drain and source regions can comprise amorphous silicon and silicon epitaxially grown from the channel layer.

The structure also includes a substrate connected to the first oxide layer and the drain and source regions can comprise silicon epitaxially grown from the channel layer and from the substrate. Further, the channel layer comprises a single crystal silicon layer.

With the present invention, sidewall deposition and etch techniques are employed to provide a sidewall dielectric between the double-gate electrodes and the source/drain independently from the bottom gate oxide and the top gate oxide. Thus, with the invention the thickness of the sidewall dielectric can be independently controlled, which allows the invention to reduce the overlap capacitance between the source/drain and the gate electrodes.

Also, the invention allows for band-gap engineering at the source/drain to channel junction to improve performance. The invention allows for the incorporation of impurity (such as carbon, nitrogen . . . etc.) during epitaxial growth to minimize dopant diffusion during thermal cycles subsequent to the source/drain junction formation process.

Further, the present invention achieves self-alignment of the top/bottom gates without relying on multiple sidewall etch process and subsequent lateral recessing of the bottom gate. The accuracy of alignment of the bottom gate to the top gate in this invention is not limited by the lateral etching control as it is conventionally.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A–1D are schematic diagrams of the completed device of the invention;

FIGS. 6A–6E are schematic diagrams that illustrate another embodiment of the invention that forms a sidewall spacer;

FIGS. 7A and 7B are schematic diagrams that illustrated two cross sections following the deposition of the SiGe and the silicon cap layer.

DETAILED DESCRIPTION OF PREFERRED EMBODIMENTS OF THE INVENTION

Figure 1D:
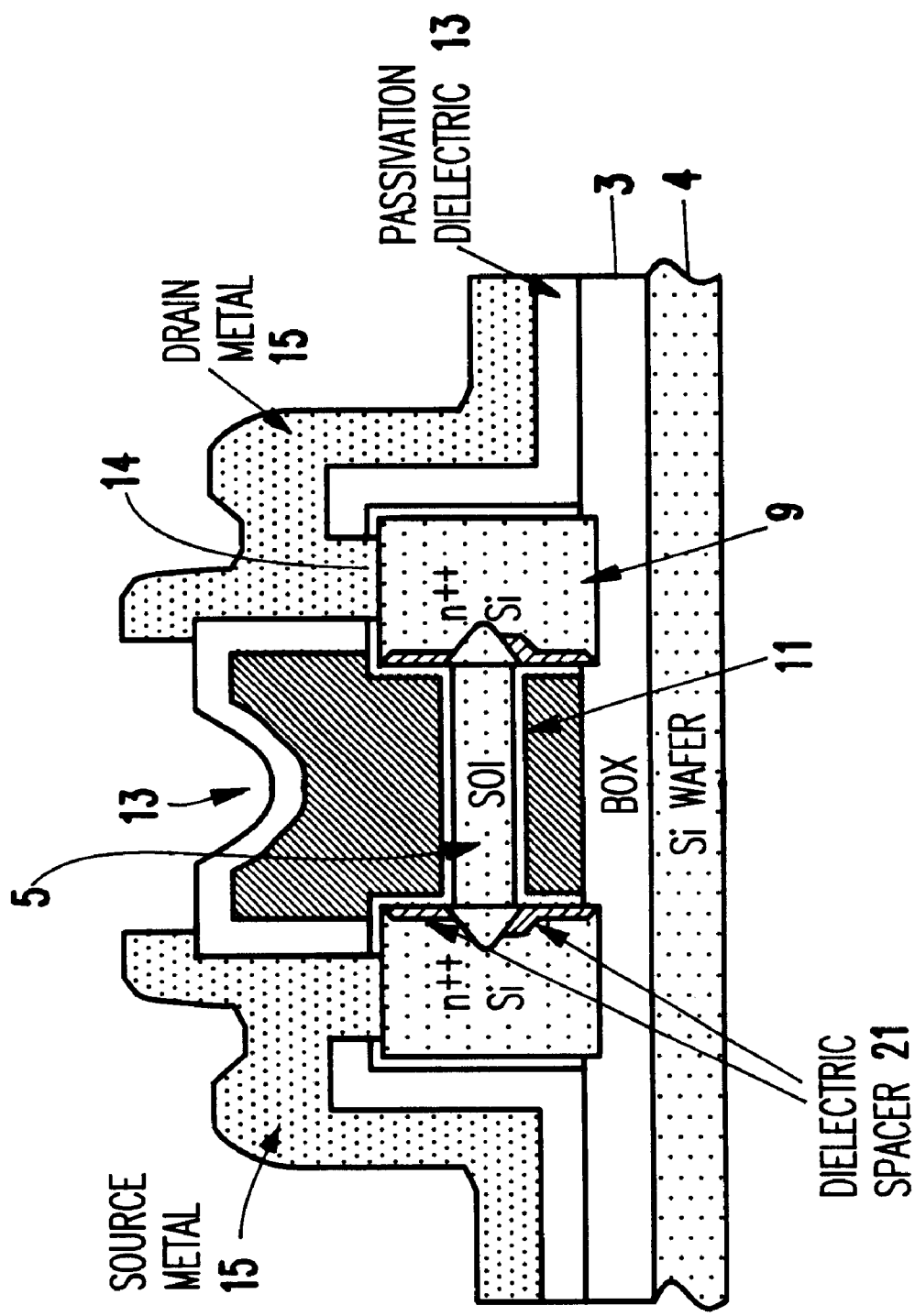
Figure 2A:
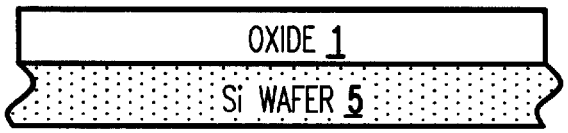
FIGS. 2A–2BB are schematic diagrams illustrating one preferred fabrication sequence employed to achieved the final device.

Referring now to the drawings, and more particularly to FIGS. 1A–1D, the inventive structure is illustrated. More specifically, the inventive structure includes a substrate 4, such as a silicon wafer, an insulator 3, source and drain regions 9, source, drain and gate contacts 15, contact opening 14, double-gate 12, a passivation dielectric 13, a channel region 5, an insulator and a thin gate oxide 11. FIG. 1B illustrates a top view of the inventive structure. FIG. 1A illustrates a cross-sectional view drawn along line A—A in FIG. 1B and FIG. 1C is a cross-sectional view of the structure along line B—B in FIG. 1B. FIG. 1D illustrates an alternative embodiment that includes a dielectric spacer 21, which is discussed in greater detail below with respect to FIGS. 6A–6B A preferred method of forming the foregoing structure is discussed below with respect to FIGS. 2A–2BB. Referring now to FIG. 2A, a substrate 5 and an insulator 1 are formed using conventional manufacturing and deposition techniques. For example, the substrate could comprise any common substrate, such as a single crystal silicon wafer. Similarly, the insulator 1 could be any type of insulator such as, silicon nitride, silicon dioxide and aluminum oxide. The insulator 1 could be formed (or grown) over the silicon wafer using common deposition techniques (or thermal growing techniques), such as chemical vapor deposition (CVD), physical vapor deposition (PVD), sputtering and other similar techniques. The insulator 1 preferably comprises a thermally grown silicon dioxide ($SiO_2$) formed by a hot wall diffusion furnace. Alternatively, the dielectric layer can be formed of silicon nitride, an oxide/nitride/oxide (ONO) film, tantalum pentoxide ($Ta_2O_5$) or borophosphosilicate glass (BPSG) or any other similar dielectric. The insulator 1 can have any thickness appropriate for the specific device being manufactured and, in this example, preferably has a thickness in the range of 0.1 nm to 100 nm and preferably 2 nm.

Figure 2B:

As shown in FIG. 2B, a second insulator 2, such as silicon dioxide, aluminum oxide and preferably silicon nitride, is formed on top of the first insulator layer 1. As with the first insulator layer 1, the remaining material layers may have any thickness depending upon the design requirements and the second insulator layer preferably has a thickness in the range of 10 nm to 500 nm and preferably 100 nm.

Figure 2C:
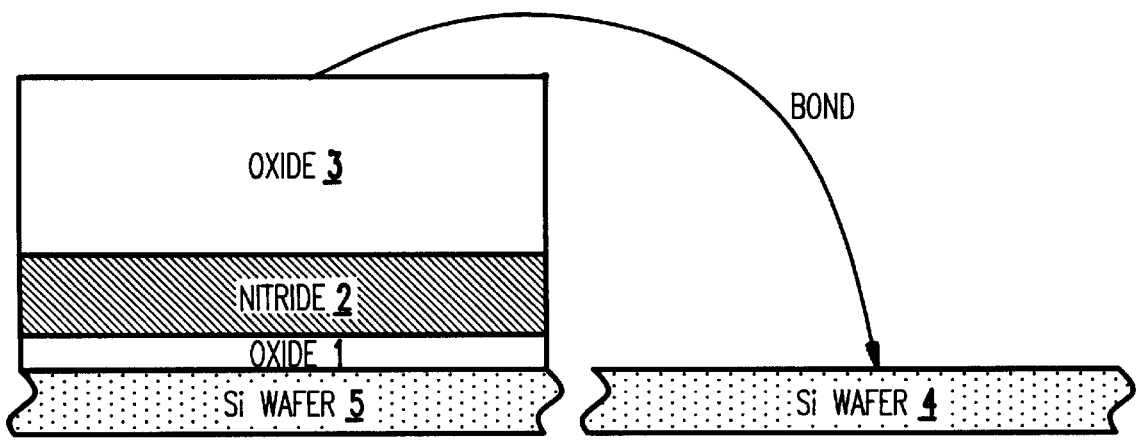

In FIG. 2C, a thick ( e.g., in the range of 10 nm to 1000 nm and preferably 300 nm) insulator layer 3, such as those discussed above (commonly referred to as a buried oxide layer, e.g., BOX), is formed, using well known techniques such as those discussed above, on top of the second insulator layer 2.

Then, as illustrated in FIG. 2C, another substrate 4, such as another single crystal silicon wafer, is bonded to the thick insulator 3 by flipping the structure 1, 2, 3, 5 over on the wafer 4, as illustrated by the arrow in FIG. 2C and using standard silicon bonding techniques such as SmartCut which is described in A. J. Auberton-Herve, IEDM Technical Digest, p. 3, 1996 and references within that paper (incorporated herein by reference) or using a boron etch stop.

The single crystal silicon (SOI) wafer 5 is thinned down to a required thickness using, for example, common planarization techniques such as chemical mechanical polishing (CMP), or oxidation and etching. In the example shown in FIG. 2D, the wafer 5 will be utilized as a channel region in a metal oxide semiconductor field effect transistor (MOSFET) and has a preferable thickness of in the range of 1 nm to 500 nm and preferably about 5 nm. The desired thickness depends on the device gate length.

Figure 2F:
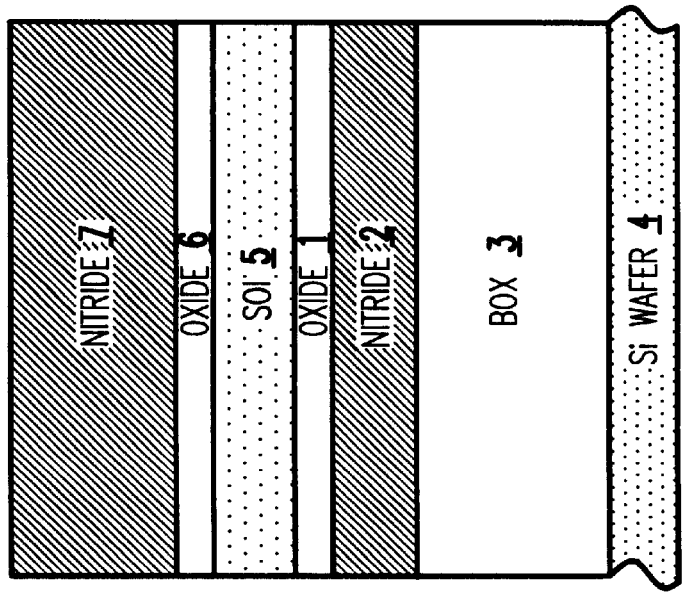
Figure 2D:
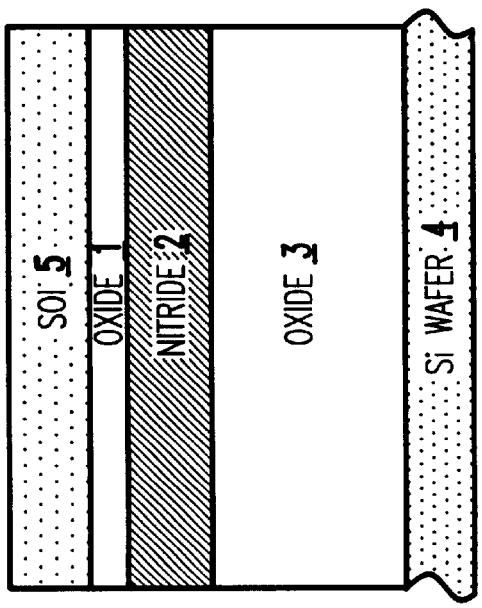
Figure 2E:
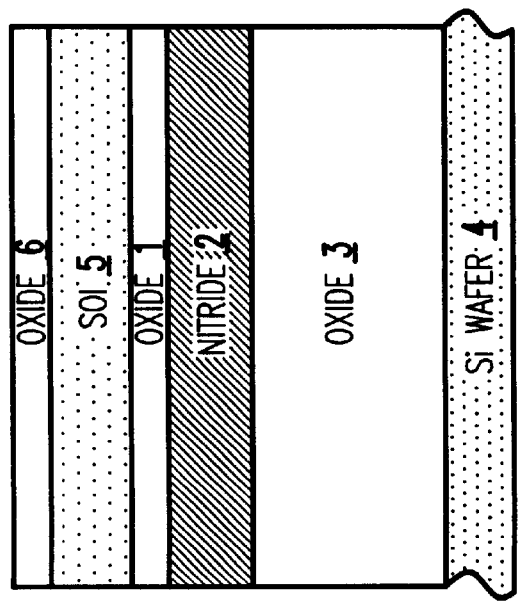

In FIG. 2E, a thin insulator, such as those discussed above and preferably silicon dioxide 6 (in the range of 0.1 nm to 100 nm and preferably about 2 nm in this example) is formed on the SOI layer 5 and, as shown in FIG. 2F, a thick insulator, such as those discussed above and preferably silicon nitride 7 (in the range of 10 nm to 500 nm and preferably about 250 nm in this example), is formed on top of the silicon dioxide layer 6.

In FIG. 2G openings 8 are etched into the stack of films, with the etch stopping some distance into the buried oxide 3. The openings 8 can be formed using any well known conventional technique, such as lithographic masking and etching. For example, the stack of films could be etched using conventional means such as a dry etching using a mixture of gases which may include $Cl_2$, $O_2$, $N_2$, $NF_3$, $SF_6$, and $CF_4$ or any similar etchant. The masking layer is preferably formed of undoped silicon glass photoresist having a thickness in the range of between about 10 nm to 100 nm and more preferably about 30 nm. As shown in FIG. 2H, which is a top view of the structure and illustrates the cross-sectional line A—A for the view shown in FIG. 2G, the distance between the openings will become the length (Lg) of the gate of the MOSFET fabricated in this example.

Figure 2I:
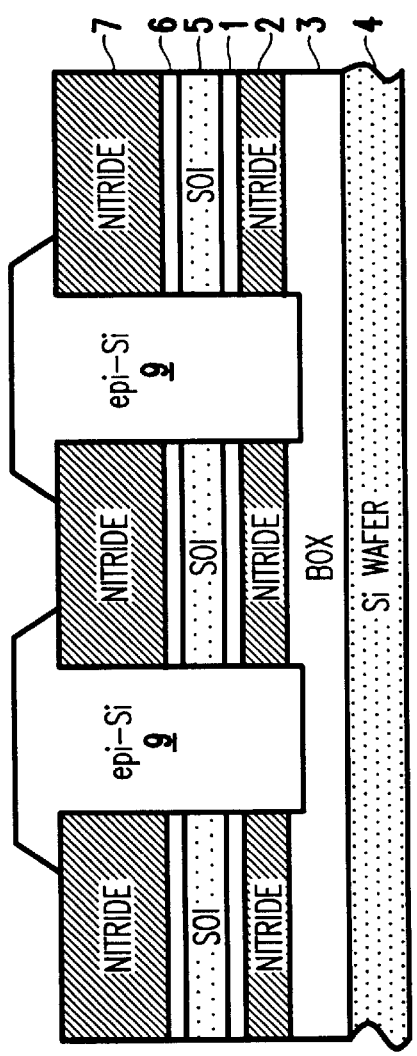
Figure 2J:
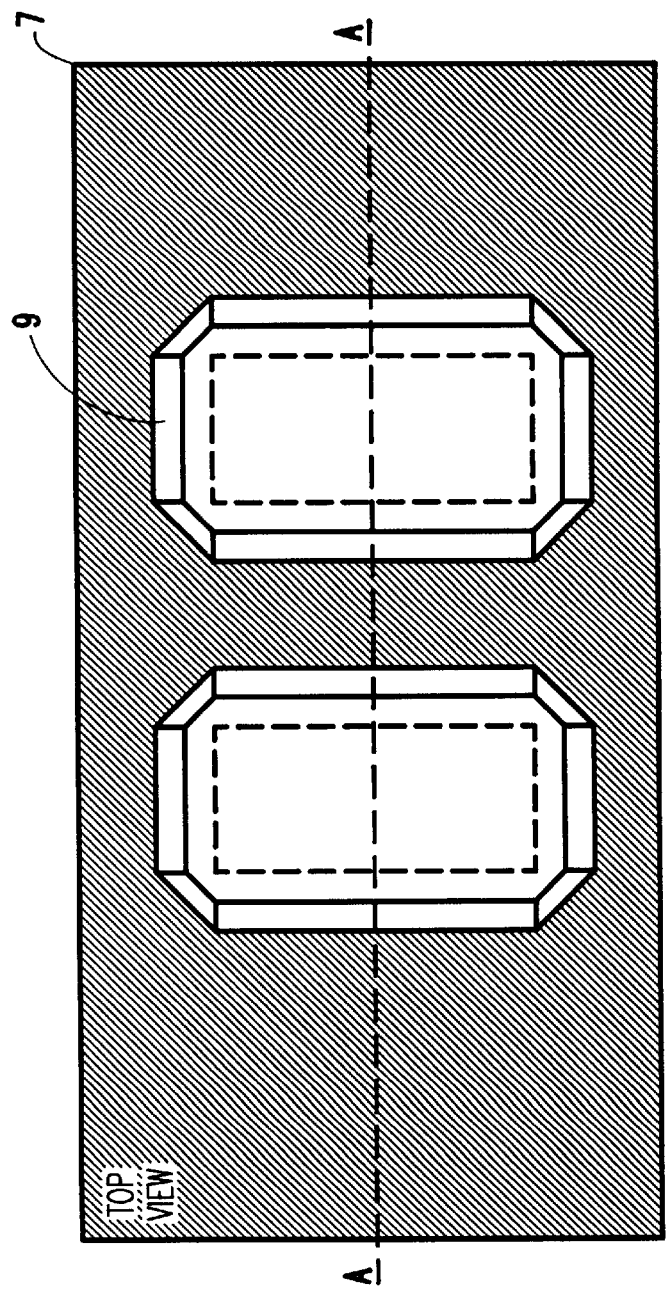

In FIG. 2I epitaxial silicon 9 is grown selectively out of the single crystal SOI channel 5 to fill the openings 8. More specifically, the structure is heated to a temperature in the range of 400° C. to 1200° C., and the silicon is heated epitaxially grown from the channel using a growth method as described earlier. Again, FIG. 2J is a top view of the structure and illustrates the cross-sectional lines A—A from which FIG. 2I is viewed.

Figure 2K:
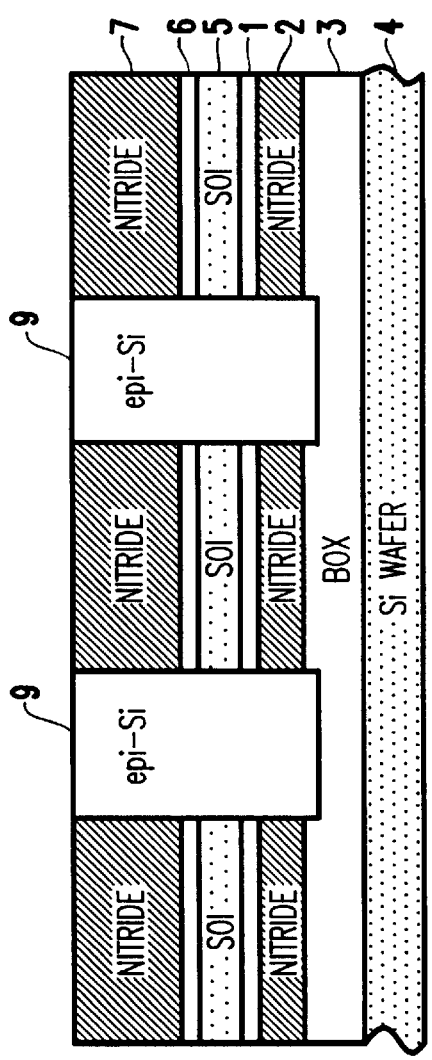
Figure 2L:
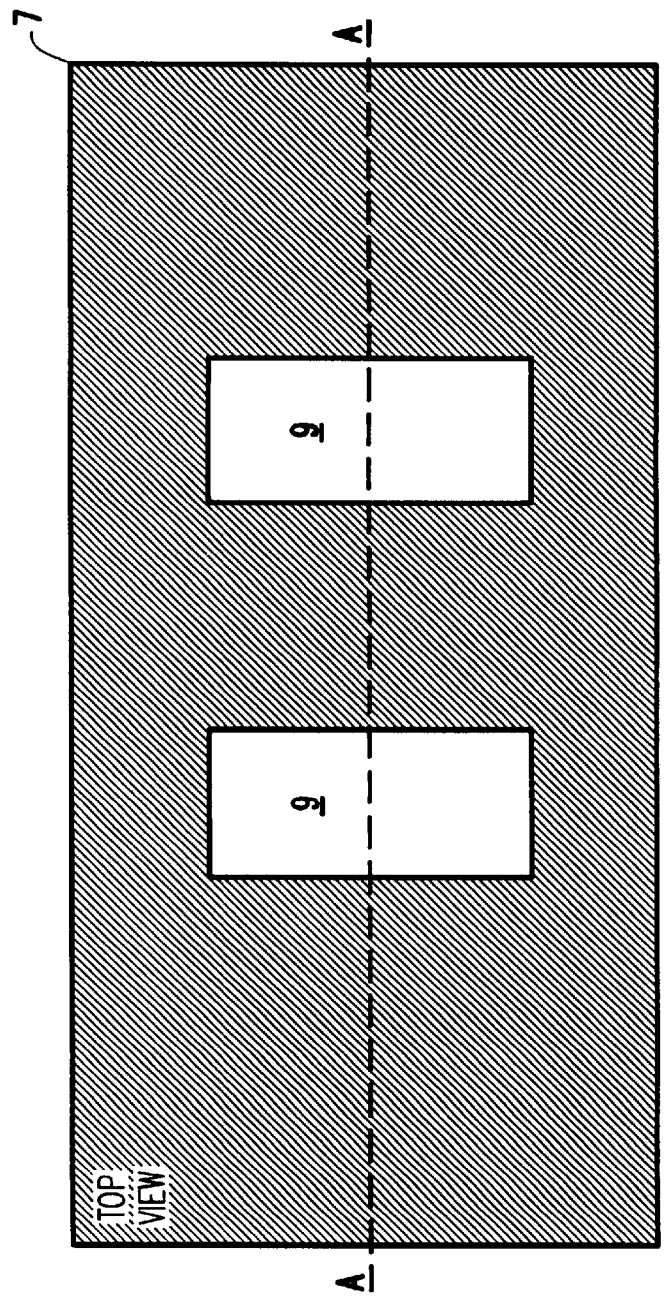

In FIG. 2K, the structure is planarized, again using well-known planarization techniques, such as those discussed above. As with the previous drawings, FIG. 2L illustrates a top view of the structure and the cross-sectional line A—A from which the structure shown in FIG. 2K is viewed.

Figure 2M:
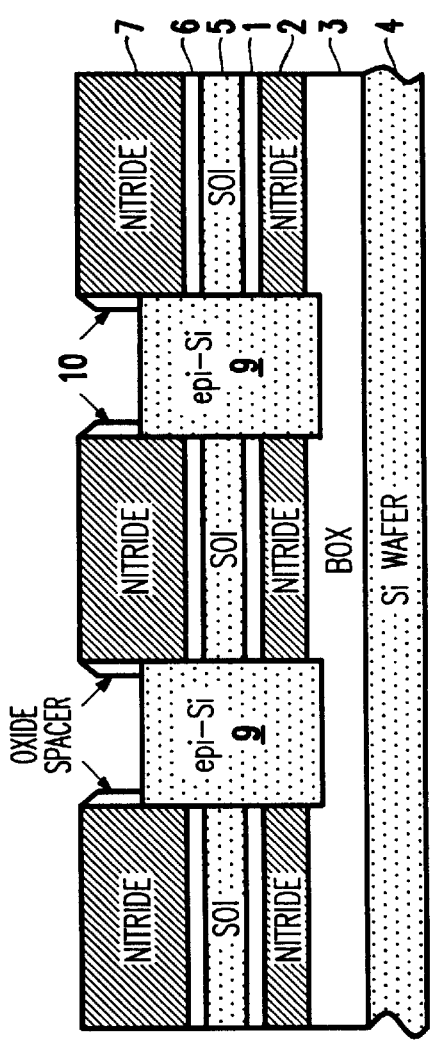
Figure 2N:
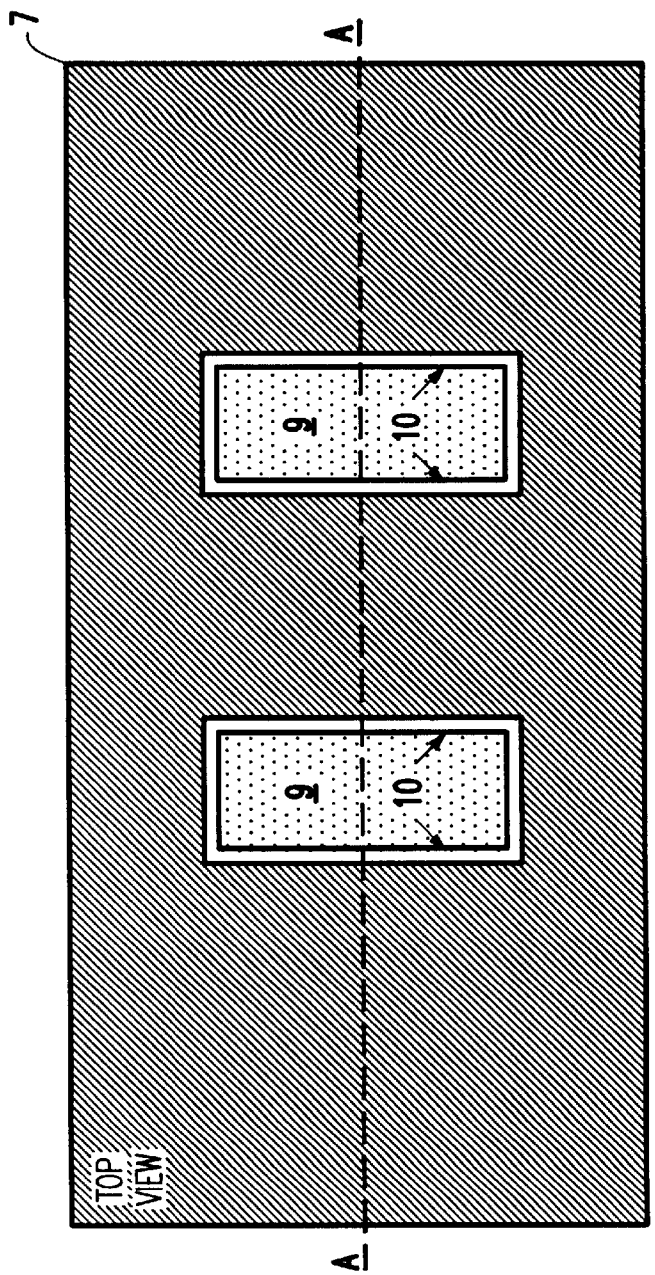

As shown in FIG. 2M, a common etching technique, such as reactive-ion-etching, is used to recess the silicon 9 in the openings 8. A dielectric 10 (such as oxide or nitride) is deposited conformally, again, using any of the deposition techniques discussed above, and subsequently etched using well known techniques, such as those discussed above, to form spacers 10. For example, anisotropic etching could be performed in a low pressure reactive ion etcher. Such etching etches the horizontal surfaces at a much higher rate (e.g., 50 times) than it etches the vertical surfaces, allowing the sidewall spacers 10 to remain after the etching process. As with the previous illustrations, FIG. 2N shows a top view of the structure shown in FIG. 2M.

Figure 2O:
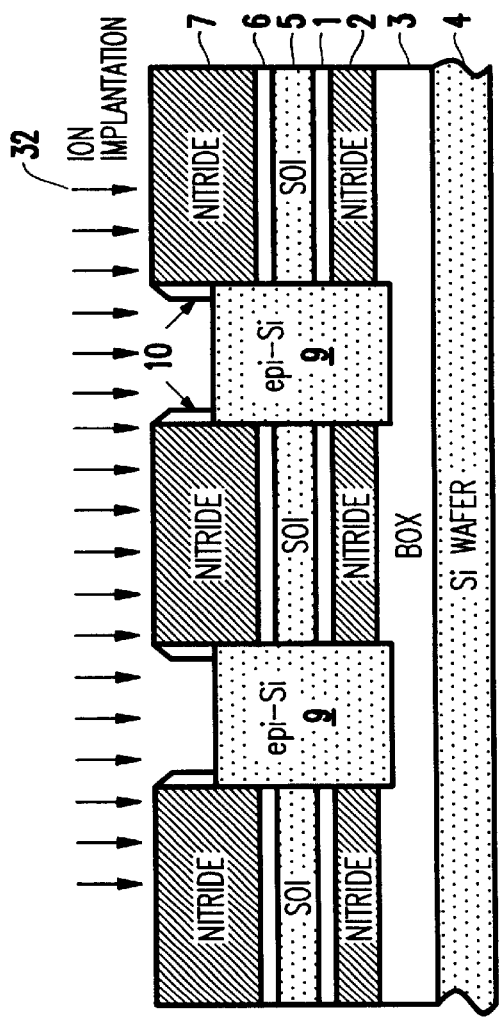

In FIG. 2O an ion-implantation 32 is used to heavily dope the silicon 9 in the openings 8 to form the source and drain regions of the exemplary MOSFET transistor. A key feature of the invention is that the patterned insulator 7 comprises a self-aligned implant mask which protects the SOI channel region 5 from the ion implantation 32. Thus, the spacer 10 offsets the source/drain implant 32 from the channel region 5.

Figure 2P:
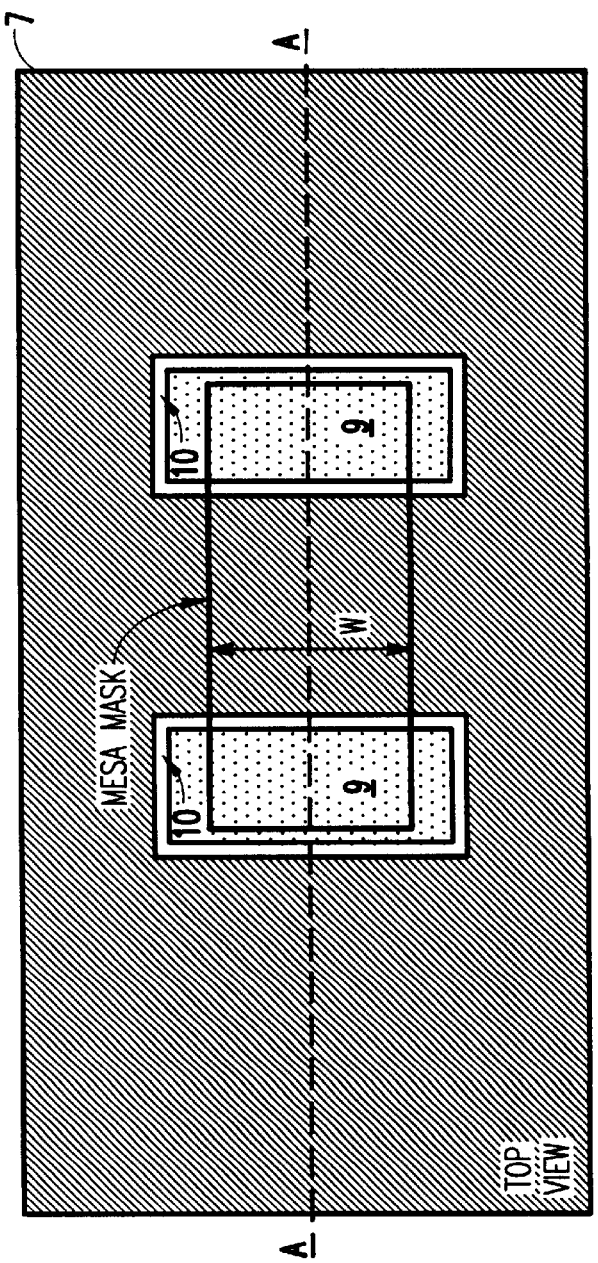
Figure 2Q:
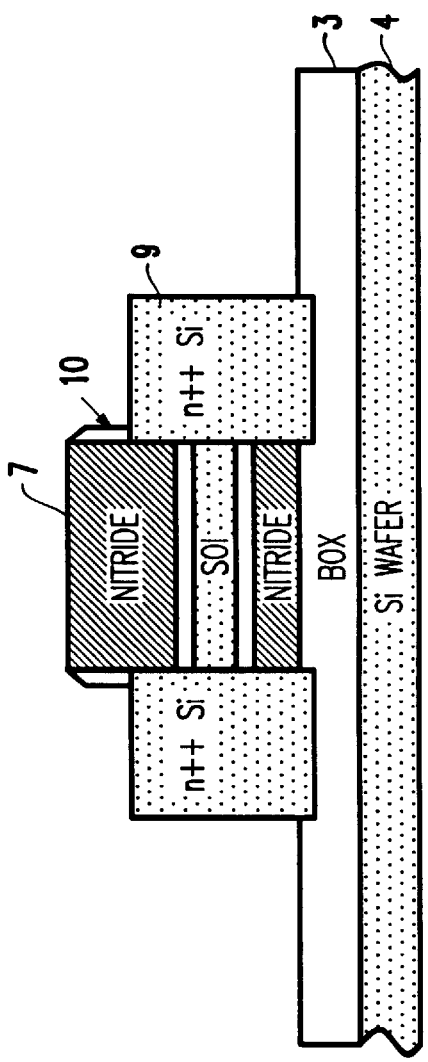
Figure 2R:
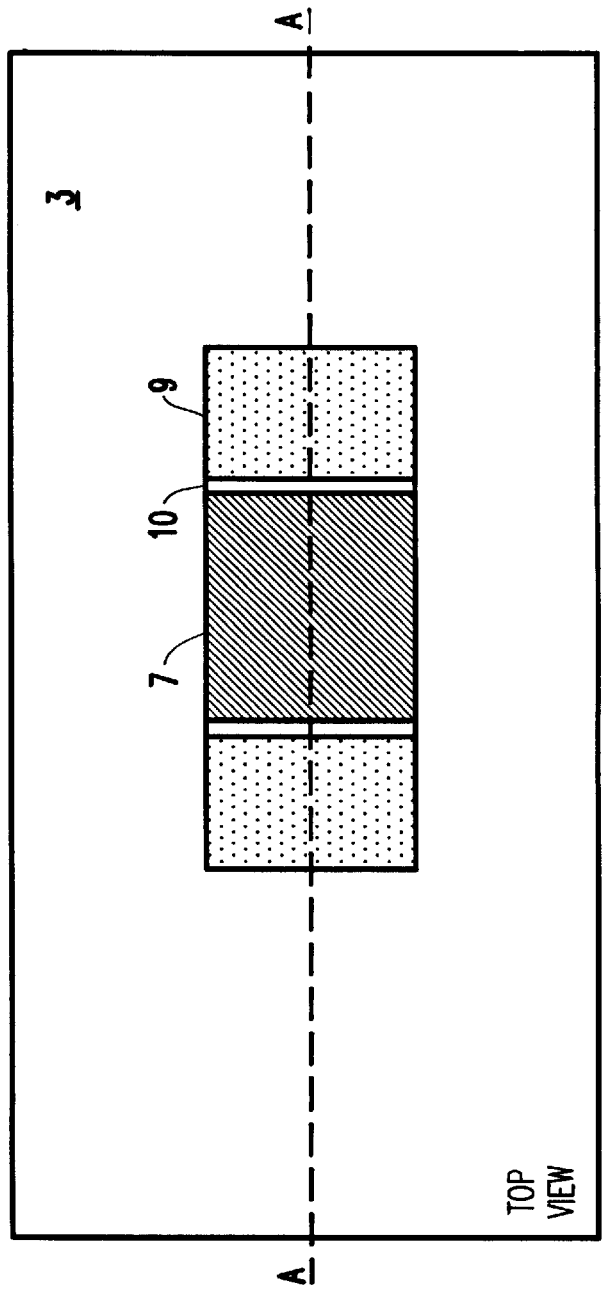

As shown in the top view of the structure in FIG. 2P, a mesa mask is formed and, as shown in FIGS. 2Q and 2R, the area not protected by the mesa mask is removed, using etching techniques, such as those discussed above, to isolate individual devices of the MOSFET device being described in this example.

Figure 2S:
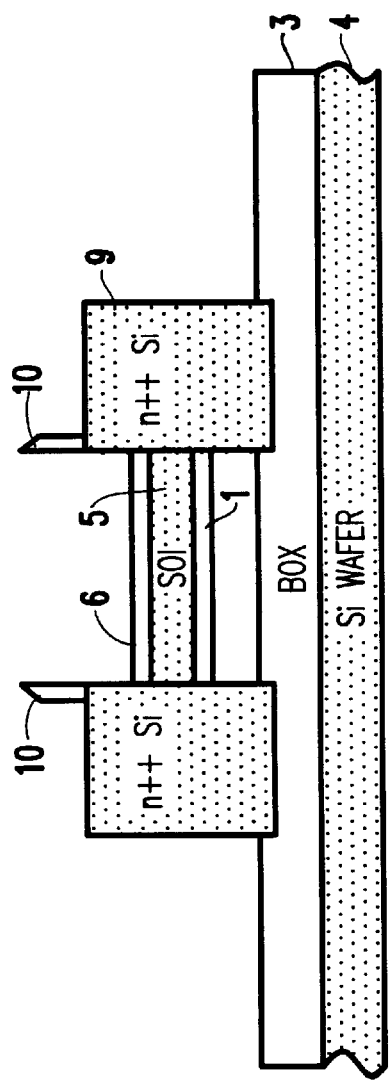
Figure 2T:
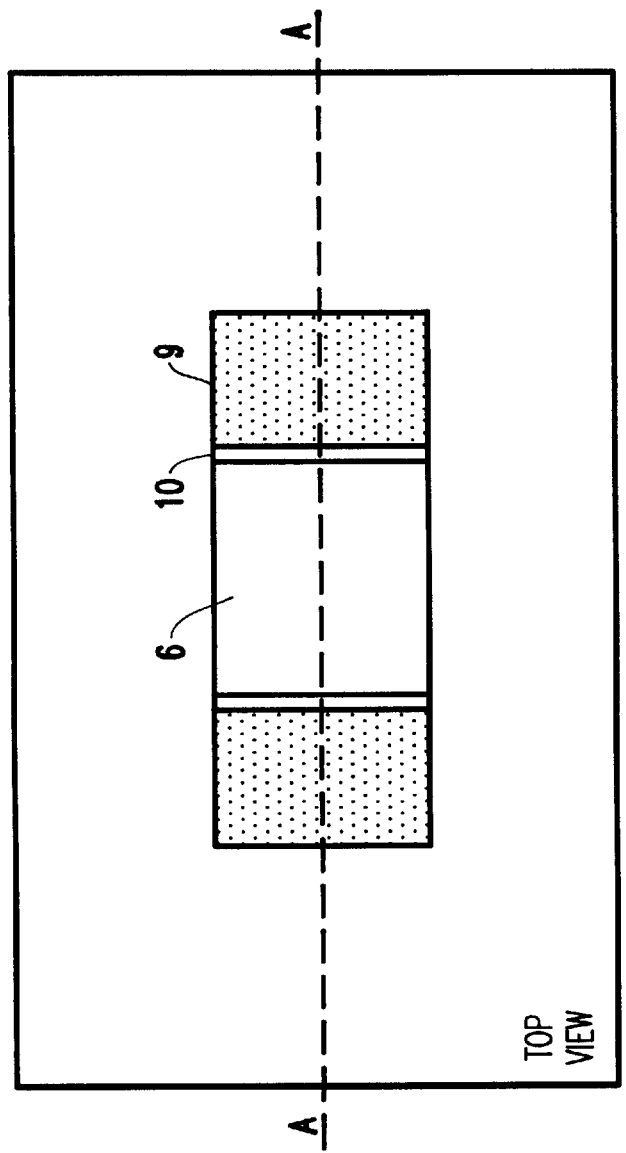
Figure 2U:
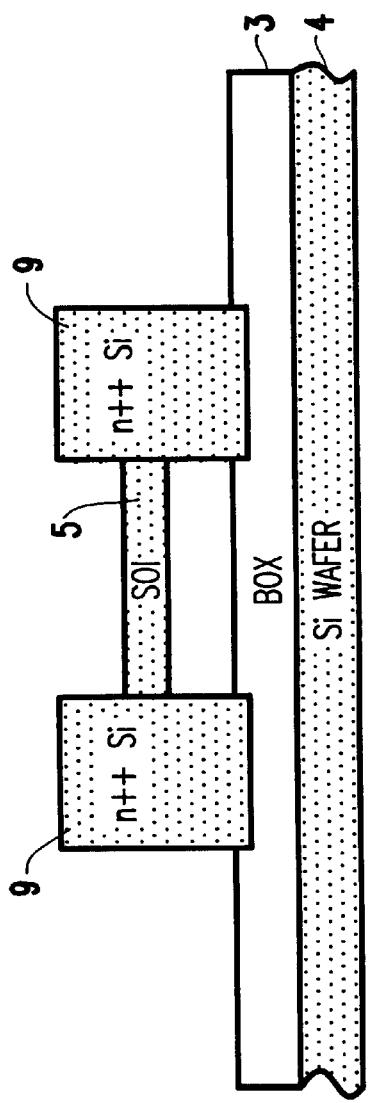
Figure 2V:
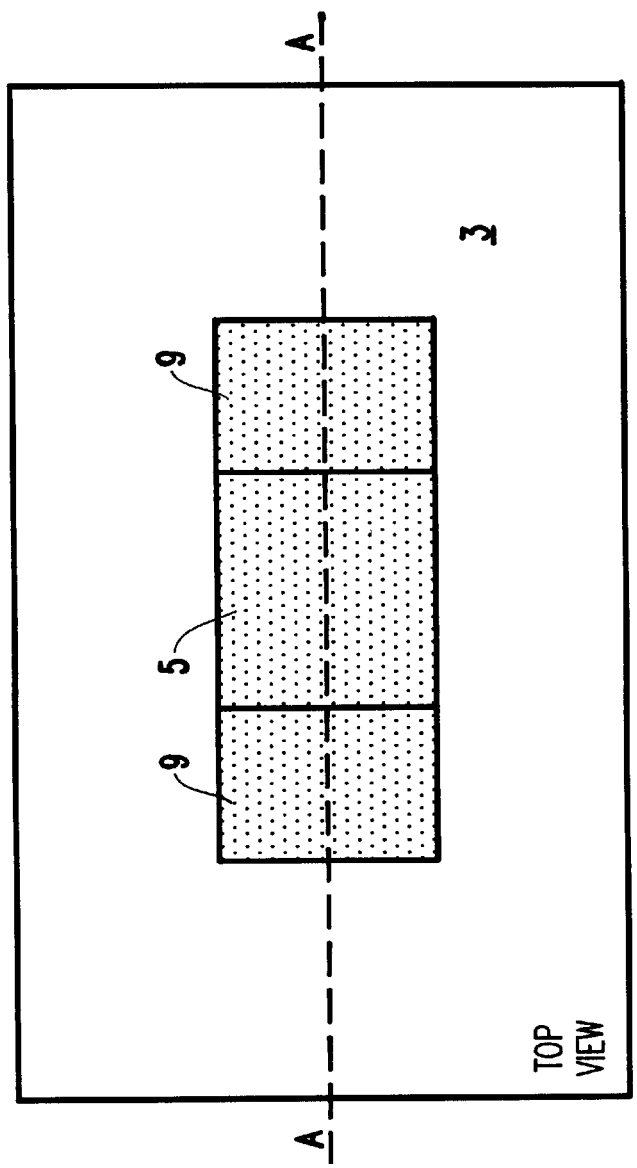

In FIGS. 2S and 2T, the top nitride 7 and bottom nitride 2 are removed using common etching techniques, such as wet chemical etching (e.g., hot phosphoric acid), thereby forming a suspended silicon channel 5 bridging the doped silicon (e.g., source/drain) regions 9. As shown in FIGS. 2U and 2V, the insulator layers 1, 6 (e.g., sacrificial pad oxides) are removed using a common etching process, such as a wet chemical etch (e.g., using hydrofluoric acids).

Figure 2W:
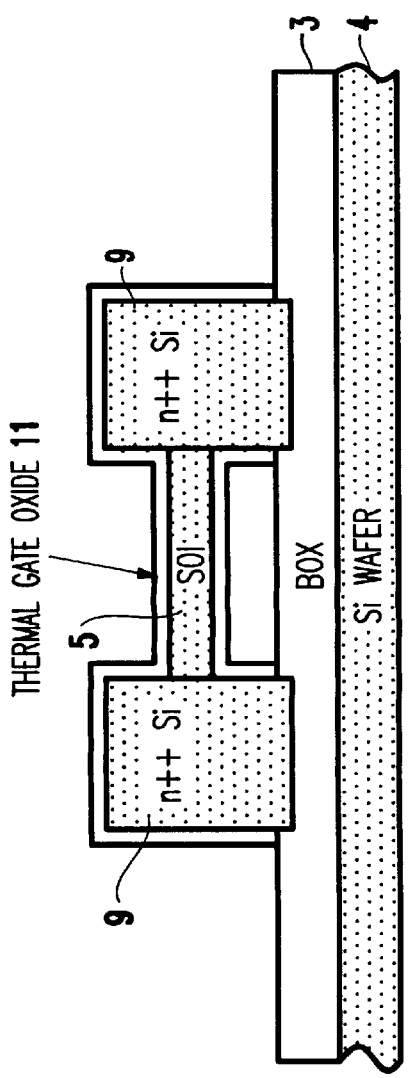
Figure 2X:
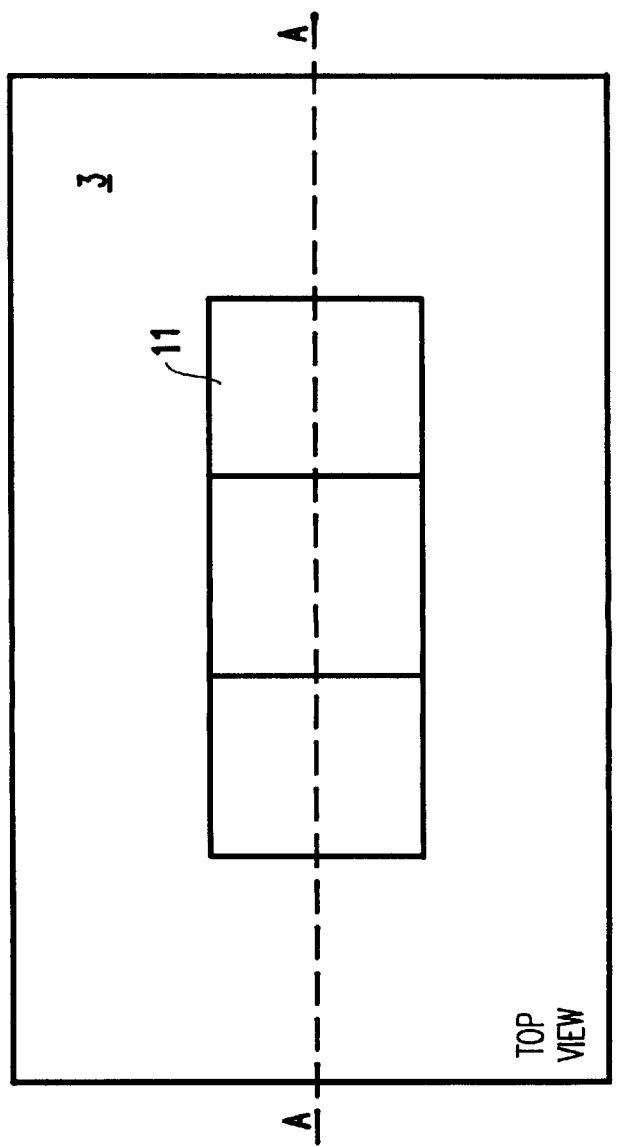

A conformal gate quality insulator 11 (e.g., oxide) is grown or deposited (e.g., preferably thermally grown) on both the top and bottom surface of the SOI channel 5, using well known techniques, such as those discussed above, as shown in the cross-sectional and top view in FIGS. 2W and 2X.

Figure 2Y:
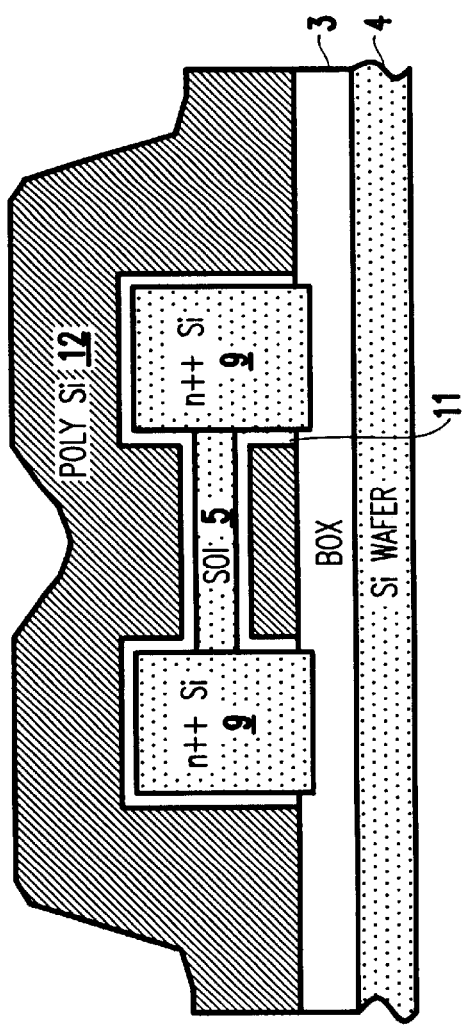
Figure 2Z:
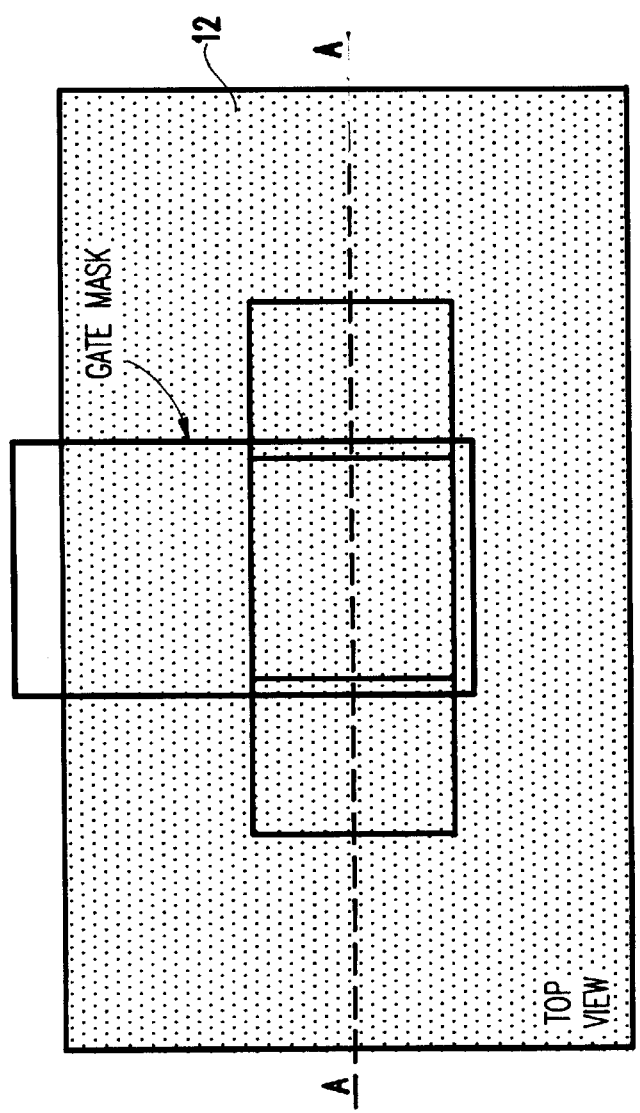
Figure 2A:
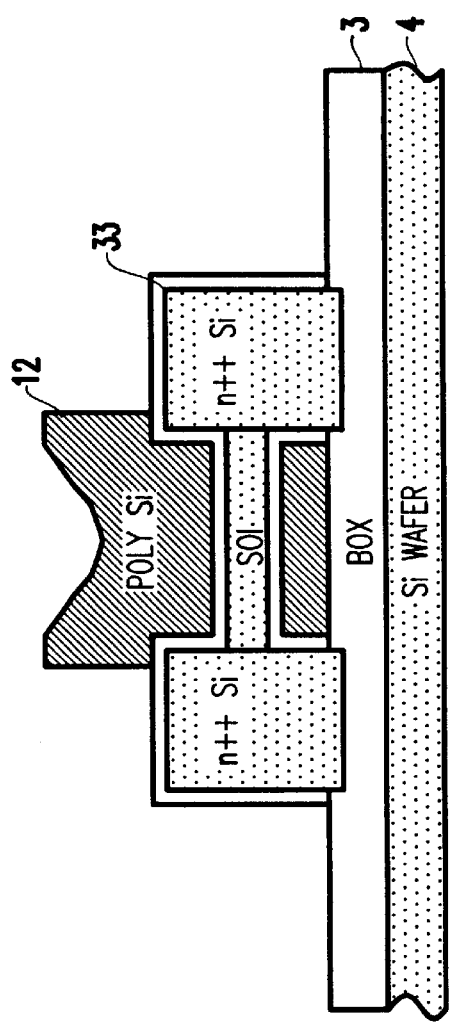
Figure 2B:
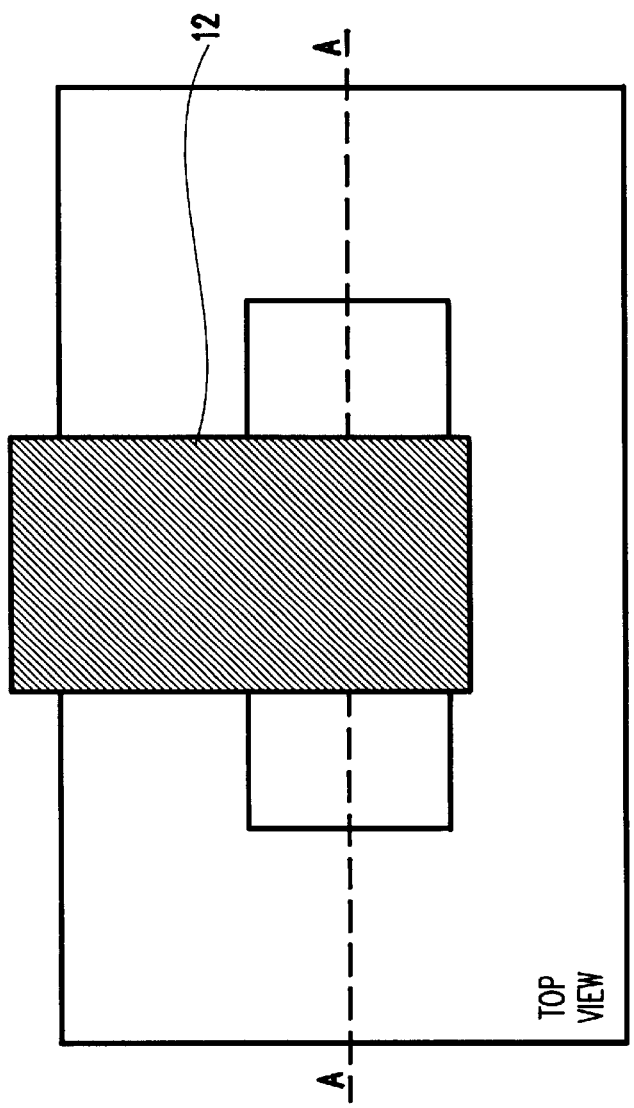

In FIG. 2Y a conductor material 12 (e.g., metal, alloy, doped polysilicon, tungsten, copper, etc.) is conformally deposited around the gate oxide 11 to form a double-gate conductor in the MOSFET structure being discussed in this example. As shown in FIG. 2Z, a gate mask is formed over the conductor material 12. Then, a selective etch is applied to remove from the conductor material 12 not protected by the gate mask, resulting in the structure shown in FIGS. 2AA and 2BB.

To complete the final structure shown in FIGS. 1A–1C, a passivation dielectric 13 is deposited, again using conventional deposition techniques, such as those discussed above. Contact openings 14 are formed through the passivation dielectric 13 and the oxide dielectric 11 to expose the source and drain regions 9 using, for example, conventional photolithographic pattering and etching processes such as those discussed above, as shown in FIGS. 1A and 1B. Additionally, similar contact openings 14 are formed through the passivation dielectric 13 to expose the conductive material 12, as shown in FIGS. 1B and 1C. A conductive material 15 is then deposited and subsequently patterned (again, using masking and etching techniques well known to those ordinarily skilled in the art, such as those discussed above) to form electrical contacts 15 to the source and drain 9, and the double-gate conductor 12.

FIG. 3A–3D illustrate an alternative embodiment whereby the source/drain regions 9 are formed by deposition of amorphous silicon, instead of the epitaxially grown silicon used in the previous embodiment.

Figure 3A:
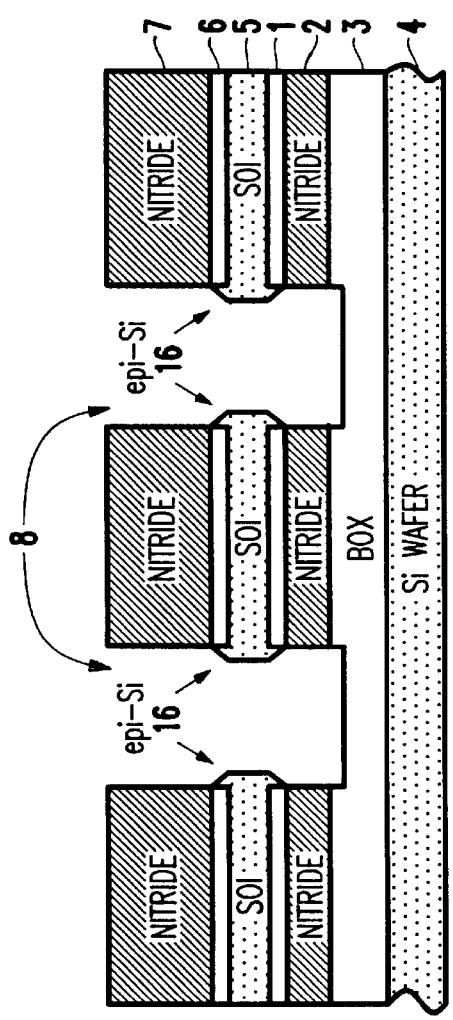
FIGS. 3A–3D are schematic diagrams that illustrate another embodiment of the invention.
Figure 3B:
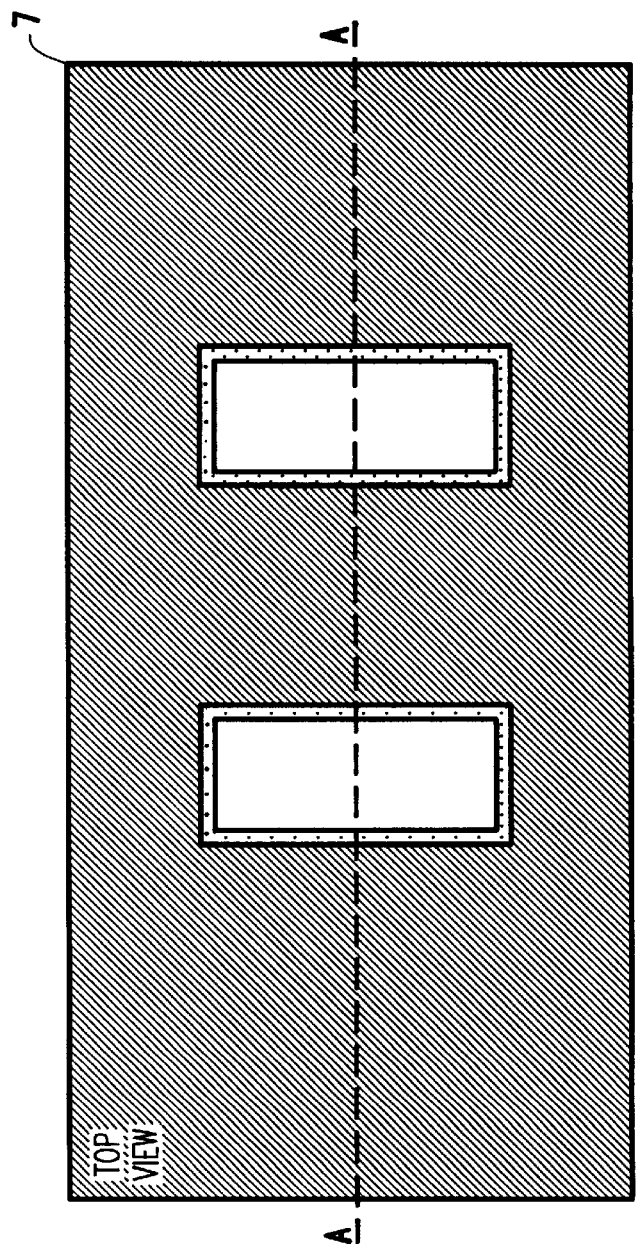

More specifically, as shown in FIG. 3A, epitaxial silicon 16 is grown out of the SOI channel for a small distance (e.g., about 20 nm). This growth process is similar to the growth process discussed above with respect to the epitaxial silicon 9; however, while the above processes is continued for a relatively long time period, this embodiment limits the growth process to a shorter time period to limit the growth of the epitaxial silicon within a range of 1 nm to 100 nm.

Figure 3C:
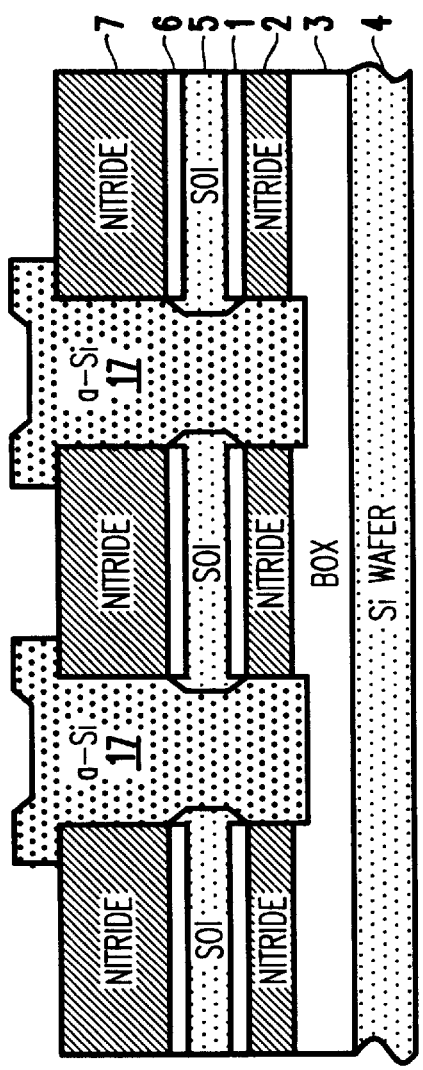
Figure 3D:
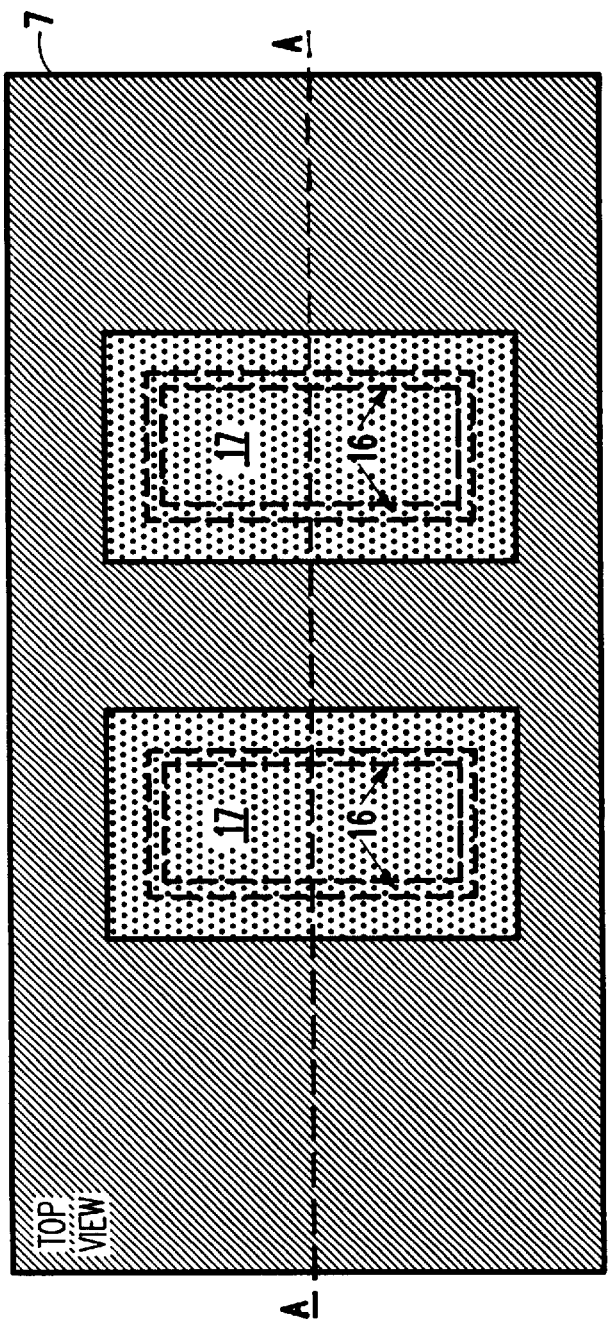

In FIG. 3C amorphous silicon 17 is then deposited using conventional deposition processes, such as those discussed above, to form the source/drain regions 17. Otherwise, the remainder of the fabrication process is similar to that shown in FIGS. 2A–2BB.

FIGS. 4A–4E illustrate another alternative embodiment in which the source/drain regions are formed by epitaxial growth from the silicon as well as epitaxial growth from the SOI channel 5.

Figure 4A:
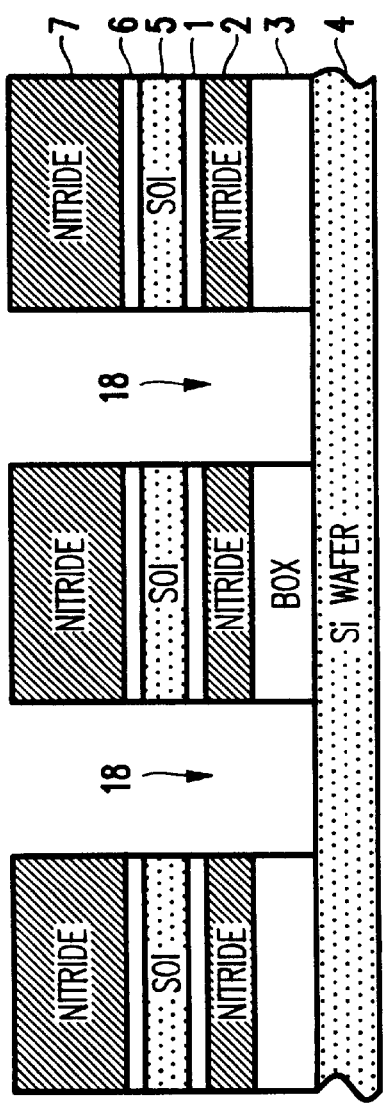
FIGS. 4A–4E are schematic diagrams that illustrate another embodiment of the invention.
Figure 4B:
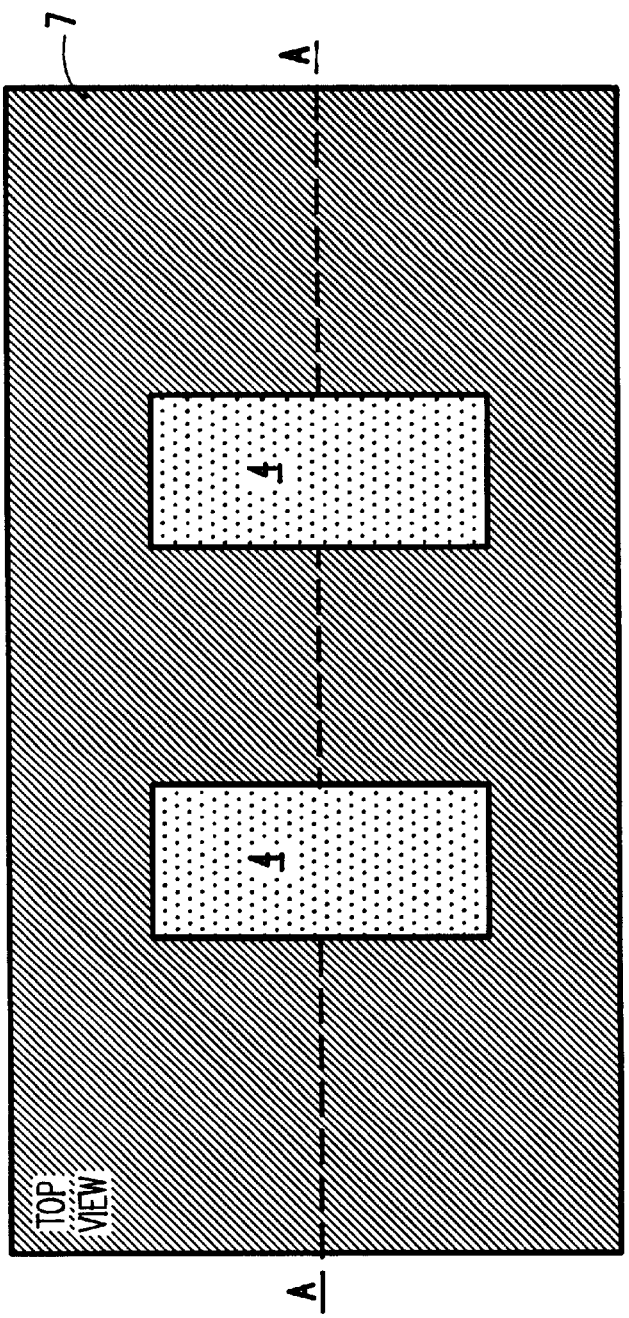

More specifically, as shown in FIG. 4A, a seed window 18 is opened by etching through the buried oxide layer box 3 down to the silicon handle wafer 4, again using the top dielectric 7 as a self-aligned mask. To form the openings 18, the etching process used to form the openings 8, discussed above with respect to FIG. 2G, can be continued for a longer period of time to allow the openings 18 to extend completely down to the substrate 4. Alternatively, a different etching process can be applied to the structure after the formation of the previous openings 8, using the top dielectric 7 as a self-aligned masked. In case where the top dielectric 7 does not provide enough etch selectivity, a separate mask may be patterned and the oxide layer BOX 3 can then be etched, using the additional mask, stopping on the silicon handle wafer.

Figure 4C:
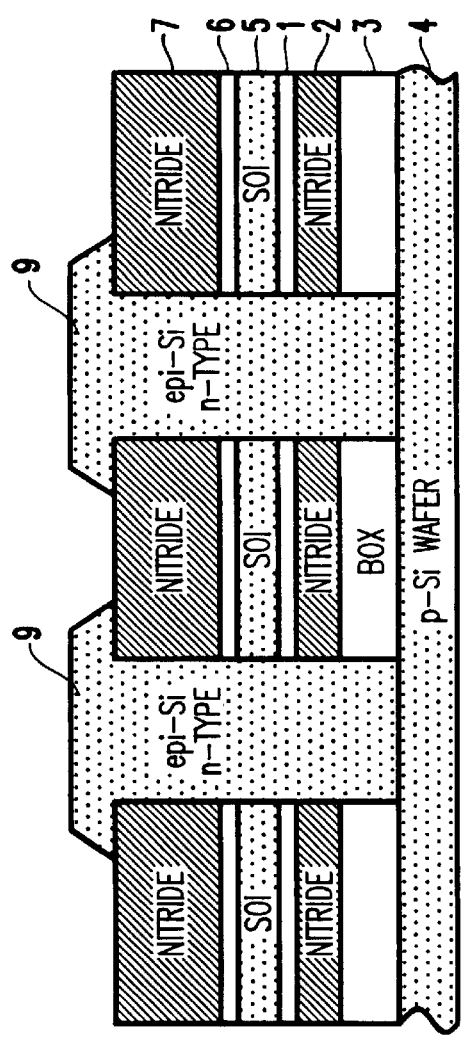
Figure 4D:
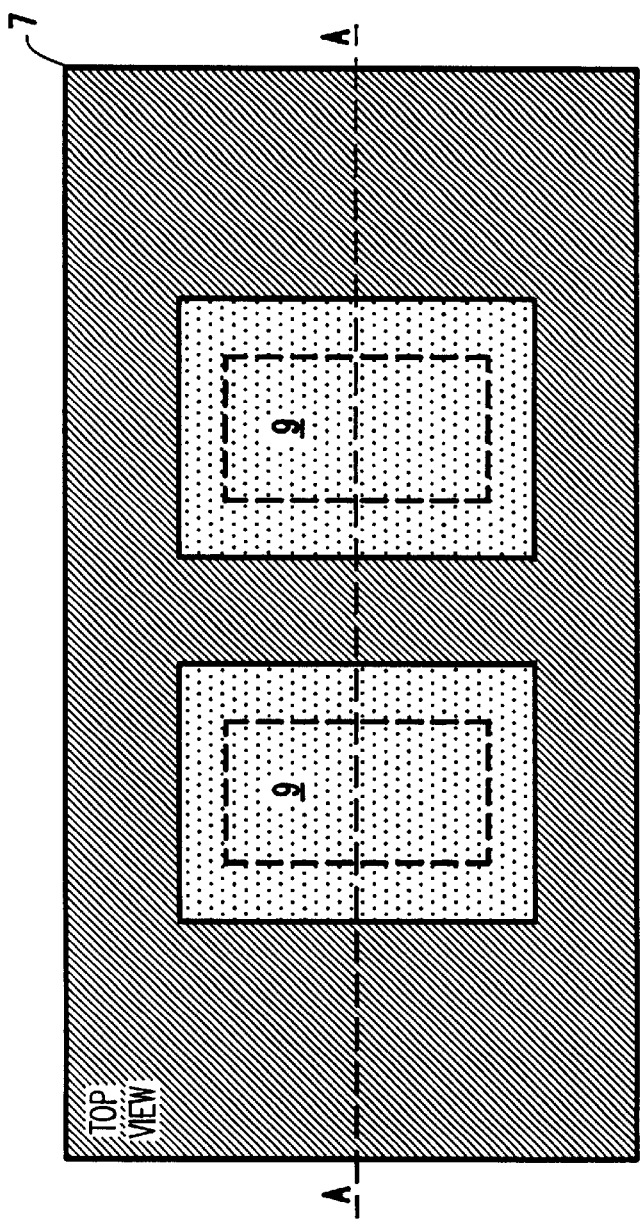

In FIGS. 4C and 4D epitaxial silicon is grown from both the seed window 18 (e.g., the silicon wafer) and the exposed edge of the SOI channel 5 until the source/drain regions 8 are filled with silicon 9.

As another alternative to this embodiment, a small amount of epitaxial silicon can be grown from the channel silicon 5 prior to exposing the silicon wafer 4. In this operation, the openings 8 and 18 would be formed in separate etching processes. A key consideration in this operation is the amount of epitaxial silicon grown from the channel silicon 5. A sufficient amount of silicon should be grown from the channel silicon 5 to ensure that the epitaxial silicon grown from the SOI channel 5 and from the silicon wafer 4 using the later formed seed window 18 will meet at a proper distance (e.g., 50 nm) away from the critical channel region. For example, an epitaxial growth process may be continued for a time period to form a partial growth of epitaxial silicon from the SOI channel 5 extending approximately 1 to 100 nm and preferably 50 nm from the sidewall of the stacked structure. This way the "contact point" is formed in a highly doped region.

Figure 4E:
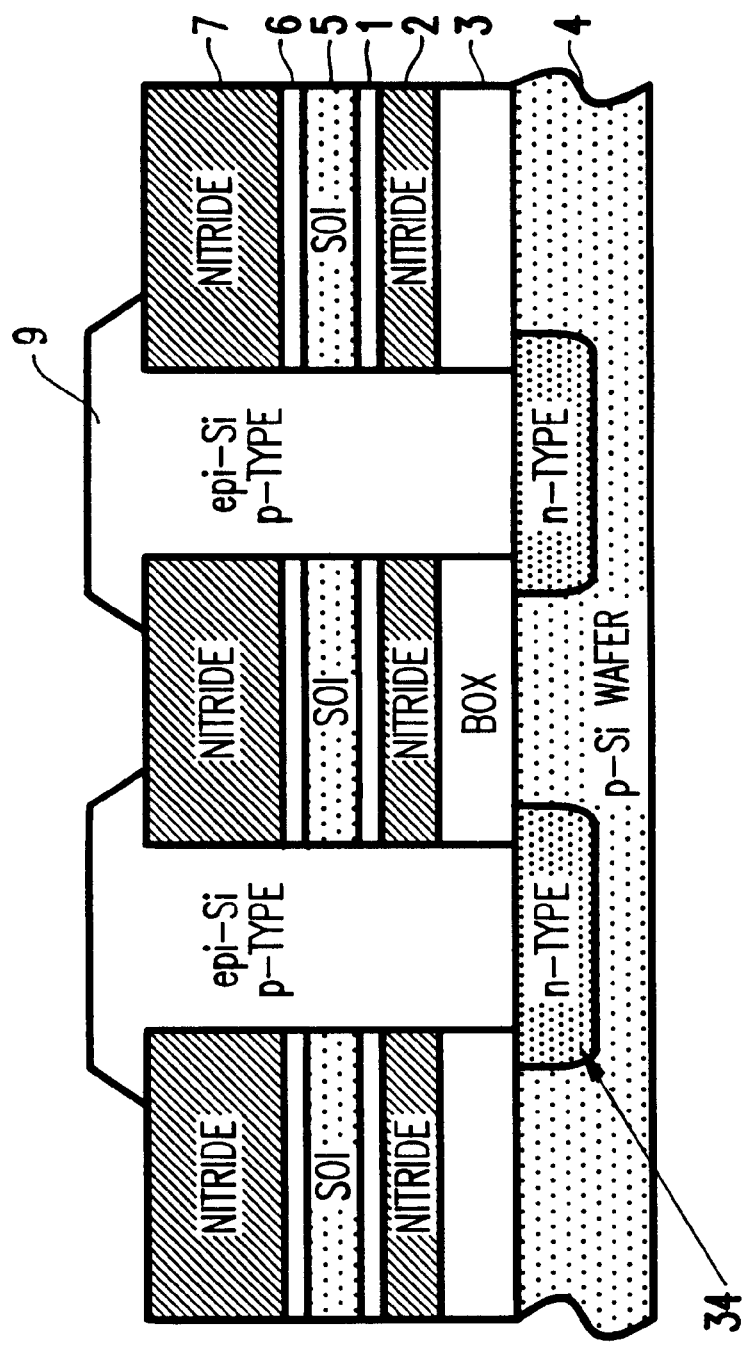

While the remainder of the fabrication process is similar to the processes discussed above with respect to FIGS. 2A–2BB, since the source and drain 9 silicon material will be in contact with the silicon of the handle wafer 4, junction isolation regions 34 should be formed in the silicon wafer 4, as shown in FIG. 4E. For example, for a NMOSFET, the region of the handle wafer 4 that forms the seed window (e.g., isolation region 34) should be p-type. Alternatively, for a PMOSFET, the region of the handle wafer that forms the seed window (e.g., isolation region 34) should be n-type. For example, for a PMOSFET, the doping can be accomplished by implanting an N-type atomic species such as arsenic or phosphorus. A typical implant might consist of phosphorus (P) or arsenic (As) at a dose of between about 1E12 to 3 E15 atoms/cm$^2$ and at an energy between about 0.1 KeV to 100 KeV. Further, the implantation may be performed using the same mask 7 that opens the seed window 18.

Also, it is desirable to limit the size of the junction isolation 34 region such that the device-to-device spacing is not limited by the junction isolation 34. The implant region 34 should always be slightly larger than the drain/source region 9 to ensure junction isolation. If the implant region is smaller than the drain/source footprint, the drain/source regions can electrically short to the substrate at these points where the junction does not extend. The use of a spacer (see FIG. 6B discussed below) prior to the junction isolation implant also allows the junction isolation implant to be offset from the edge of the source/drain region thus preventing the junction area from levitating the device-to-device spacing.

Figure 5A:
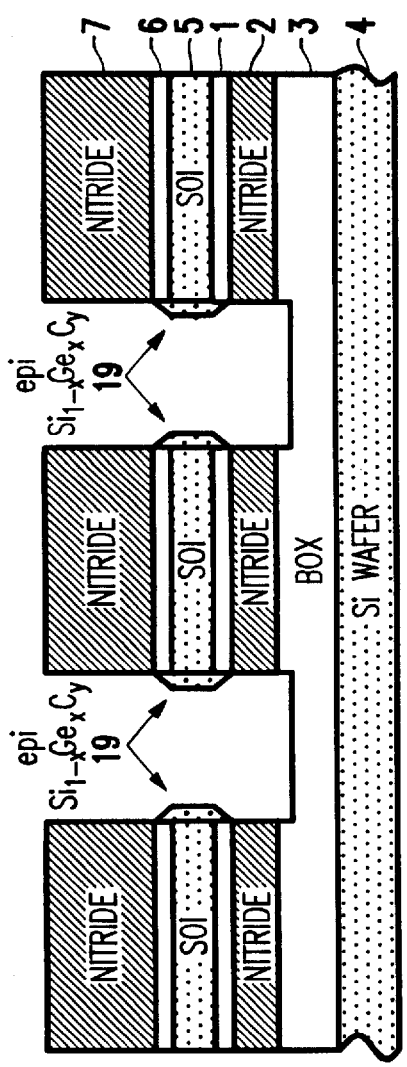
FIGS. 5A–5B are schematic diagrams that illustrate another embodiment of the invention that shows band-gap engineering.
Figure 5B:
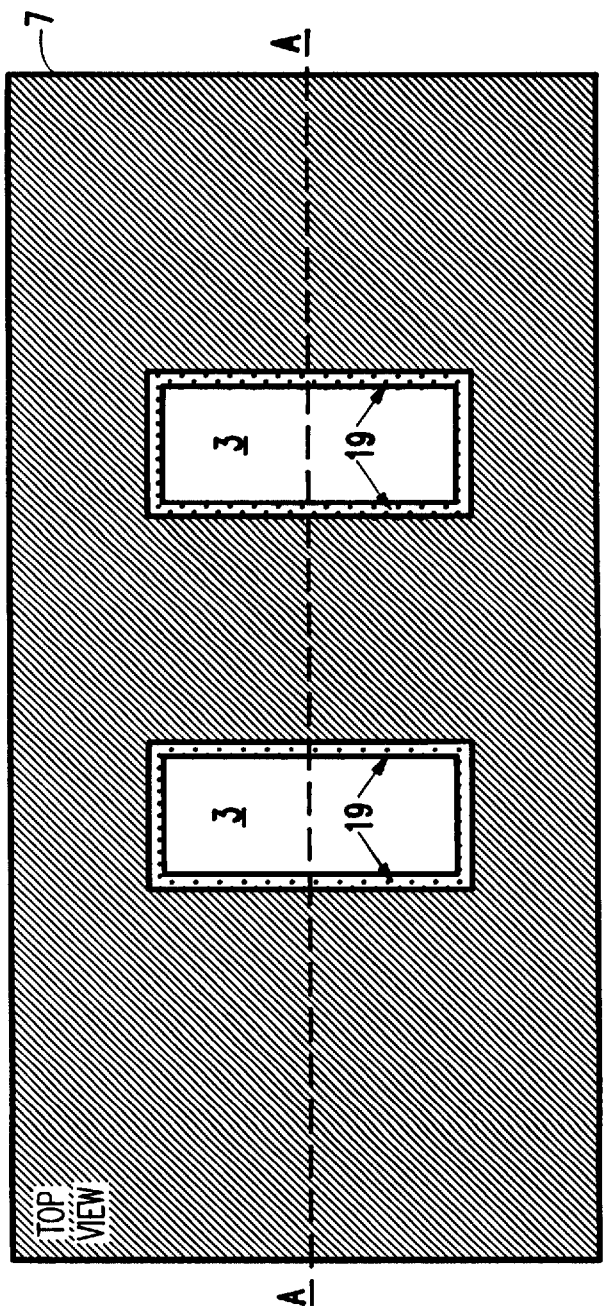

FIGS. 5A–5B illustrate another embodiment whereby band-gap engineering and/or impurity engineering can be utilized with the invention.

More specifically, as shown in FIG. 5A the epitaxial silicon 19 is grown out of the SOI channel 5. However, this embodiment is different than the previous limited silicon growth 16 in that different materials, such as Si, Ge, C, N, etc. 19, can be used in the limited material growth. The remainder of the fabrication process is similar to the process discussed above with respect to FIGS. 2A–2BB. By incorporating impurities (such as carbon, nitrogen, etc.) during epitaxial growth, dopant diffusion out of the source and drain regions 9 (e.g., during subsequent manufacturing thermal cycles) is minimized.

Incorporating impurities (such as carbon, germanium and nitrogen) is possible and may be used with any of the foregoing embodiments. The impurities may be incorporated into the material by implantation, or by in-situ doping (during epitaxial growth).

FIGS. 6A–6D illustrate another embodiment whereby a spacer of arbitrary thickness is incorporated into the device structure. More specifically, as shown in FIG. 6A epitaxial silicon 16 is grown out of the SOI channel for a small distance (e.g. 20 nm), using the processes discussed above. In addition, to more precisely control the size of the epitaxial silicon growth 16, the small epitaxial silicon growth 16 may be etched in a conventional etching process, such as those discussed above, and preferably in a reactive ion etching process to recess the region extending above the SOI channel.

An additional ion implantation into the epitaxial silicon growth 16 may be performed to improve the conductance of the access region to the SOI channel. For example, such an implantation could be applied at dose of between about 1E12 to 3 E15 atoms/cm2 and at an energy level of 0.1 KeV to 100 KeV.

As shown in FIG. 6A, a dielectric 20 is deposited conformally on the entire structure. The thickness of this dielectric determines the resultant spacer thickness. The dielectric 20 may be any suitable dielectric, such oxide-nitride-oxide (ONO) or any of the dielectrics discussed above, to provide etch selectivity.

A reactive ion etch is employed, as discussed above, to form a spacer 21, as shown in FIG. 6B. FIGS. 6C and 6D illustrates the result of an isotropic etching process (e.g., reactive ion etching or wet chemical etching) performed to remove residues 22 of the spacer dielectric 21 from the exposed silicon sidewall of the SOI channel 5. Then, as shown in FIG. 6E, amorphous silicon 31 is deposited to form the source/drain regions. Alternatively, epi silicon may be re-grown from the exposed SOI channel extension 16 to fill up the drain and source regions. The remainder of the fabrication process is similar to the process discussed above with respect to FIGS. 2A–2BB.

A typical $Si_xGe_{1-x}$ MOSFET uses a SiGe film sandwiched between two layers of silicon as the channel for the device. Due to the different band gap energies of silicon and silicon-germanium the SiGe film forms a quantum well which confines the carriers to the SiGe film. One advantage of SiGe FETs is their higher channel mobility as compared with Si FETs.

Using the procedure described in this invention, a SiGe double gate structure may be realized. To form such a structure the previously described device process steps are carried up to the point were a suspended SOI bridge 5 is formed as shown in FIG. 2U. To reduce the overlap capacitance, the invention introduces the dielectric spacer 21 as discussed above, following the epi extension 16 growth step. As shown in FIGS. 7A and 7B, the SiGe layer 35 is selectively grown all around the SOI bridge 5, using a growth technique such as chemical vapor deposition (CVD). A silicon cap layer 36 is then deposited all around the SOI bridge 5, covering the SiGe film 35. FIGS. 7A and 7B show the device in two cross sections following the deposition of the SiGe and the silicon cap layer. From this point and further on the process steps are identical to the process step discussed above. More specifically, following the growth of the silicon cap layer 36, a thermal gate oxide 11 is grown as shown in FIG. 2W, followed by a gate conductor deposition as shown in FIG. 2Y. The gate conductor material is then patterned, as shown in FIG. 2AA, and the isolation dielectric 13 is deposited. Finally, contact opening 14 and metallization 15 complete the device fabrication.

Figure 8:
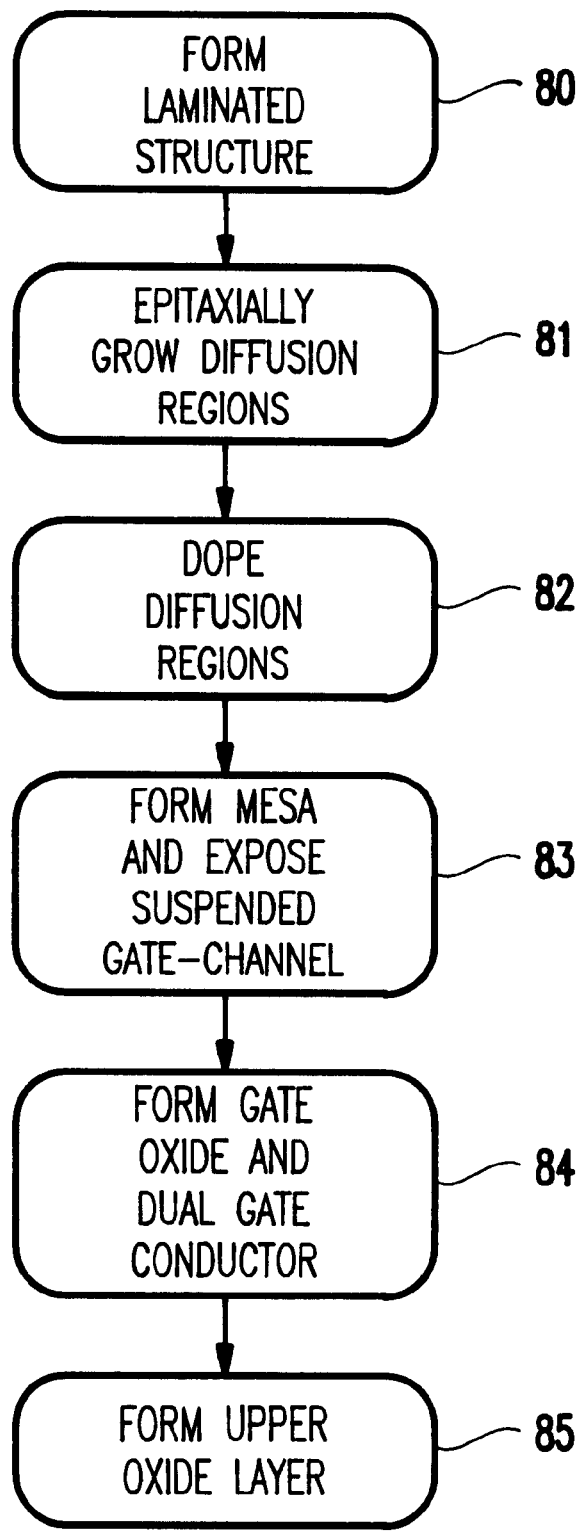
FIG. 8 is a flowchart of a preferred embodiment.

FIG. 8 is a flowchart of a preferred embodiment of the invention. In item 80, the laminated structure shown in FIG. 2F is formed. In item 81, the openings 8 are formed in the laminated structure and drain and source regions 9 are epitaxially grown from the single crystal silicon channel layer 5, as shown in FIG. 2I.

As shown in FIG. 2O, the diffusion region 9 is doped using the nitride layer 7 as a self-aligned mask, as indicated in item 82. In item 83, the mesa mask is formed and the majority of the laminated structure is removed to form the channel region 5 suspended between the drain and source regions 9, as illustrated in FIG. 2U. Then, the gate oxide the 11 and the double-gate conductor 12 are formed, as shown in the items 84 and the upper oxide 13 is formed, as shown in item 85.

The inventive process and structure discussed above are superior to conventional processes and structures in a number of respects. For example, the insulator between the source/drain and the gate electrode is conventionally formed during the growth of the top/bottom gate oxides. As such, the thickness of this conventional insulator is dependent on the thickness of the gate oxide and cannot be independently controlled to reduce the overlap capacitance between the gate electrode and the source/drain regions.

However, with the present invention, sidewall deposition and etch techniques are employed to provide a sidewall dielectric 11 between the double-gate electrodes 12 and the source/drain 9 independently from the bottom oxide 3 and the top oxide 13. Thus, with the invention, the thickness of the sidewall dielectric 11 can be independently controlled, as shown in FIG. 2W, which allows the invention to reduce the overlap capacitance between the source/drain 9 and the gate electrodes 12.

As discussed above, the use of band-gap engineering (e.g. SiGe) for the source/drain of the MOSFET improves performance. This present invention allows for band-gap engineering at the source/drain to channel junction.

The invention also allows for the incorporation of an impurity (such as carbon, nitrogen) during epitaxial growth to minimize dopant diffusion during thermal cycles subsequent to the source/drain junction formation process.

Also, the quality of the silicon channel 5 in this invention is identical to good quality single crystal bulk silicon since the channel is formed by wafer 5 bonding and not by selective epitaxial growth. In the invention, only the source/drain regions 9 are epitaxially grown. Because the source/drain 9 will be degenerately doped, material defects in the source /drain regions are not as critical.

Further, the present invention achieves self-alignment of the top/bottom gates without relying on multiple sidewall etch process and subsequent lateral recessing of the bottom gate as is done conventionally. The accuracy of alignment of the bottom gate to the top gate in this invention is not limited by the lateral etching control as it is conventionally.

While the invention has been described in terms of preferred embodiments, those skilled in the art will recognize that the invention can be practiced with modification within the spirit and scope of the appended claims. For example, while the invention has been described with reference to MOSFET structure, as would be known by one ordinarily skilled in the art given this disclosure, the invention is applicable to all similar integrated circuit devices including semiconductor devices, transistors and other field effect type devices.

What is claimed is:

1. A method of manufacturing a double-gate integrated circuit comprising:

forming a laminated structure having a channel layer and first insulating layers on each side of said channel layer;

forming openings in said laminated structure;

lining said openings with a second insulating layer;

forming drain and source regions in said openings over said second insulating layer;

doping said drain and source regions, using said openings in said laminated structure to align said doping;

removing portions of said laminated structure to leave said channel layer and said first insulating layers suspended from said drain and source regions; and forming a double-gate conductor on said second insulating layer such that said double-gate conductor includes a first conductor on a first side of said channel layer and a second conductor on a second side of said channel layer.

2. The method in claim 1, wherein, during said forming of said double-gate conductor, said drain and source regions and said second insulating layer self-align said double-gate conductor.

3. The method in claim 1, wherein said forming of said laminated structure includes forming a bottom insulator layer adjacent one of said first insulating layers and said method further comprises, after said forming of said double-gate conductor, forming a top insulator layer on an opposite side of said double-gate conductor from said bottom insulator layer, such that a thickness of said second insulating layer is independent of a thickness of said bottom insulator layer and said top insulator layer.

4. The method in claim 1, wherein said channel layer comprises a single crystal silicon layer and said forming of said laminated structure includes depositing said first insulating layers on each side of said single crystal silicon layer.

5. The method in claim 1, wherein, before said forming of said drain and source regions, said method further comprises forming spacers in said openings.

6. A method of manufacturing a double-gate integrated circuit comprising:

forming a laminated structure having a channel layer and first insulating layers on each side of said channel layer;

forming openings in said laminated structure;

forming drain and source regions in said openings;

doping said drain and source regions, using said openings in said laminated structure to align said doping;

removing portions of said laminated structure to leave said channel layer suspended from said drain and source regions;

forming a second insulating layer to cover said drain and source regions and said channel layer;

forming a double-gate conductor on said second insulating layer such that said double-gate conductor includes a first conductor on a first side of said channel layer and a second conductor on a second side of said channel layer; and forming of said drain and source regions comprises epitaxially growing drain and source regions in said openings from said channel layer.

7. A method of manufacturing a double-gate integrated circuit comprising:

forming a laminated structure having a channel layer and first insulating layers on each side of said channel layer;

forming openings in said laminated structure;

forming drain and source regions in said openings;

doping said drain and source regions, using said openings in said laminated structure to align said doping;

removing portions of said laminated structure to leave said channel layer suspended from said drain and source regions;

forming a second insulating layer to cover said drain and source regions and said channel layer; and forming a double-gate conductor on said second insulating layer such that said double-gate conductor includes a first conductor on a first side of said channel layer and a second conductor on a second side of said channel layer, wherein said forming of said drain and source regions comprises epitaxially growing a portion of said drain and source regions in said openings from said channel layer and filling a remainder of said openings with amorphous silicon to complete said drain and source regions.

8. A method of manufacturing a double-gate integrated circuit comprising:

forming a laminated structure having a channel layer and first insulating layers on each side of said channel layer;

forming openings in said laminated structure;

forming drain and source regions in said openings;

doping said drain and source regions, using said openings in said laminated structure to align said doping;

removing portions of said laminated structure to leave said channel layer suspended from said drain and source regions;

forming a second insulating layer to cover said drain and source regions and said channel layer;

forming a double-gate conductor on said second insulating layer such that said double-gate conductor includes a first conductor on a first side of said channel layer and a second conductor on a second side of said channel layer; wherein:

said forming of said laminated structure includes attaching a substrate to said laminated structure;

said forming of said openings includes exposing said substrate; and said forming of said drain and source regions comprises epitaxially growing said drain and source regions in said openings from said channel layer and said substrate.

9. A method of manufacturing a double-gate metal oxide semiconductor transistor comprising:

forming a laminated structure having a single crystal silicon channel layer and insulating oxide and nitride layers on each side of said single crystal silicon channel;

forming openings in said laminated structure;

forming drain and source regions in said openings;

doping said drain and source regions, using said openings in said laminated structure to align said doping;

removing portions of said laminated structure to leave said single crystal silicon channel layer suspended from said drain and source regions;

forming a gate oxide layer to cover said drain and source regions and said single crystal silicon channel layer; and forming a double-gate conductor over said gate oxide layer such that said double-gate conductor includes a first conductor on a first side of said single crystal silicon channel layer and a second conductor on a second side of said single crystal silicon channel layer.

10. The method in claim 9, wherein, during said forming of said double-gate conductor, said drain and source regions and said gate oxide layer self-align said double-gate conductor.

11. The method in claim 9, wherein said forming of said laminated structure includes forming a lower oxide layer adjacent one of said first insulating layers and said method further comprises, after said forming of said double-gate conductor, forming an upper oxide layer on an opposite side of said double-gate conductor from said lower oxide layer, such that a thickness of said gate oxide layer is independent of a thickness of said upper oxide layer and said lower oxide layer.

12. The method in claim 9, wherein said forming of said drain and source regions comprises epitaxially growing silicon in said openings from said single crystal silicon channel layer.

13. A method of manufacturing a double-gate metal oxide semiconductor transistor comprising:

forming a laminated structure having a single crystal silicon channel layer and insulating oxide and nitride layers on each side of said single crystal silicon channel;

forming openings in said laminated structure;

forming drain and source regions in said openings;

doping said drain and source regions, using said openings in said laminated structure to align said doping;

removing portions of said laminated structure to leave said single crystal silicon channel layer suspended from said drain and source regions;

forming a gate oxide layer to cover said drain and source regions and said single crystal silicon channel layer; and forming a double-gate conductor over said gate oxide layer such that said double-gate conductor includes a first conductor on a first side of said single crystal silicon channel layer and a second conductor on a second side of side single crystal silicon channel layer, wherein said forming of said drain and source regions comprises epitaxially growing silicon in a portion of said openings from said single crystal silicon channel layer and filling a remainder of said openings with amorphous silicon to complete said drain and source regions.

14. The method in claim 9, wherein:

said forming of said laminated structure includes attaching a silicon substrate to said laminated structure;

said forming of said openings includes exposing said silicon substrate; and said forming of said drain and source regions comprises epitaxially growing silicon in said openings from said single crystal silicon channel layer and said silicon substrate.

15. The method in claim 9, wherein, before said forming of said drain and source regions, said method further comprises forming spacers in said openings.

* * * * *